US011317518B1

(12) United States Patent
Marggraff et al.

(10) Patent No.: US 11,317,518 B1
(45) Date of Patent: *Apr. 26, 2022

(54) METHOD FOR PRODUCING ELECTRICAL CONNECTIONS

(71) Applicants: Lewis James Marggraff, Lafayette, CA (US); Nelson G. Publicover, Bellingham, WA (US); Blake Marggraff, Lafayette, CA (US); Edward D. Krent, Sharon, MA (US); Marc M. Thomas, Mokelumne Hill, CA (US)

(72) Inventors: Lewis James Marggraff, Lafayette, CA (US); Nelson G. Publicover, Bellingham, WA (US); Blake Marggraff, Lafayette, CA (US); Edward D. Krent, Sharon, MA (US); Marc M. Thomas, Mokelumne Hill, CA (US)

(*) Notice: Subject to any disclaimer, the term of this patent is extended or adjusted under 35 U.S.C. 154(b) by 76 days.

This patent is subject to a terminal disclaimer.

(21) Appl. No.: 16/558,255

(22) Filed: Sep. 2, 2019

Related U.S. Application Data

(63) Continuation of application No. 15/339,702, filed on Oct. 31, 2016, now Pat. No. 10,412,840.

(Continued)

(51) Int. Cl.
H05K 3/40 (2006.01)
H05K 1/11 (2006.01)
(Continued)

(52) U.S. Cl.
CPC ..... H05K 3/4046 (2013.01); H01L 21/76885 (2013.01); H01L 21/76898 (2013.01);
(Continued)

(58) Field of Classification Search
CPC ...... H05K 1/0313; H05K 1/115; H05K 3/007; H05K 3/4046; H05K 2201/10022;
(Continued)

(56) References Cited

U.S. PATENT DOCUMENTS 3,268,652 A * 8/1966 Burns ............... H01R 12/58
174/262
5,050,295 A * 9/1991 Sullivan ............ H05K 3/4046
29/830
(Continued)

*Primary Examiner* — Carl J Arbes
(74) *Attorney, Agent, or Firm* — Vista IP Law Group LLP; William A English

(57) ABSTRACT

Systems and methods are provided to produce electromechanical interconnections within integrated circuits (ICs), printed circuit boards (PCBs) and between PCBs and other electronic components such as resistors, capacitors and integrated circuits. Elements include so-called "smart pins" or "neuro-pins" that facilitate electrical pathways in the dimension normal to the plane of a PCB. Smart pins or neuro-pins may be inserted using automated processes that do not require the high temperatures normally associated with soldering. Resultant circuits generally contain a large number of layers that are more compact and more readily constructed compared with conventional PCB-based circuitry.

17 Claims, 28 Drawing Sheets

Related U.S. Application Data

(60) Provisional application No. 62/249,108, filed on Oct. 30, 2015.

(51) Int. Cl.
*H01L 21/768* (2006.01)
*H05K 1/03* (2006.01)
*H05K 3/00* (2006.01)

(52) U.S. Cl.
CPC ........... *H05K 1/0313* (2013.01); *H05K 1/115* (2013.01); *H05K 3/007* (2013.01); *H05K 2201/10022* (2013.01); *H05K 2201/10303* (2013.01)

(58) Field of Classification Search
CPC .... H05K 2201/10303; H01L 21/76885; H01L 21/76898
See application file for complete search history.

(56) References Cited

U.S. PATENT DOCUMENTS

| | | | | |
|---|---|---|---|---|
| 5,656,798 | A | * | 8/1997 | Kubo ................... H01L 21/486 174/263 |
| 5,834,335 | A | * | 11/1998 | Buschbom ............. H05K 3/325 438/107 |
| 2002/0093104 | A1 | * | 7/2002 | Goldmann .............. H01L 24/29 257/774 |

* cited by examiner

METHOD FOR PRODUCING ELECTRICAL CONNECTIONS

RELATED APPLICATION DATA

The present application is a continuation of application Ser. No. 15/339,702, filed Oct. 31, 2016, and issuing as U.S. Pat. No. 10,412,840, which claims benefit of provisional application Ser. No. 62/249,108, filed Oct. 30, 2015, the entire disclosures of which are expressly incorporated by reference herein.

COPYRIGHT NOTICE

Contained herein is material that is subject to copyright protection. The copyright owner has no objection to the facsimile reproduction by anyone of the patent document or the patent disclosure, as it appears in the United States Patent and Trademark Office patent file or records, but otherwise reserves all rights to the copyright whatsoever. The following notice applies to the software, screenshots and data as described below and in the drawings hereto and All Rights Reserved.

FIELD OF THE INVENTION

The present invention relates to methods and apparatus for interconnecting electrical circuits, including conductive traces and other elements within printed circuit boards (PCBs), integrated circuits (ICs) and other electronic components. Interconnection methods and apparatus are considered during the design and fabrication stages of the development of electronic components. Disclosed techniques may be useful for the assembly stage of the manufacture of electronic devices.

BACKGROUND

Most complex electronic devices use one or more printed circuit boards (PCBs) to provide both mechanical support and electrically conductive pathways to implement device functions. Variants and alternatives to PCBs include flexible circuits (also known as flex circuits or flex strips) and printed wiring boards.

Within PCBs, through holes (also spelled "thru-holes") and vias are used to provide an electrical pathway between different layers of a multi-layered PCB. Within integrated circuits, electrical connections between layers are often referred to as "through-chip vias." A via that extends to the exterior surface of a PCB or integrated circuit, and that connects to a metallic surface is referred to as a "contact" or "pad," usubally providing electrical connectivity to the outside world.

Vias are constructed by mechanical drilling, and thus generally have a circular shape. Holes are made electrically conductive (and in some applications, thermally conductive) by electroplating a metallic coating, or by lining with a conductive tube or rivet. A drilled hole via that has been made conductive is referred to as a "barrel." A via that is exposed only on one side of a PCB is called a "blind via," while a via that only interconnects internal layers of a multi-layer PCB is called a "buried via".

In present-day electronics, a via facilitates only a single electrical connection between layers within a PCB or a single contact with an external electrical component. In addition, electrical connections with metallic vias or pads are constructed using various processes (e.g., rework, reflow) involving soldering (melting of a metallic compound), exposing components to temperatures in excess of 200° C. with the potential to destroy or shorten the life of components.

The systems, apparatus, and methods herein draw from recent advances in the area of micro-fabrication. Micro-fabrication has generally benefited from systems and methods for precision positioning and micro robotics that are controlled by advanced computer-aided design software. The fabrication component draws from three areas in particular: 1) laser ablation to remove circuit substrate materials, 2) additive manufacturing, also commonly known as three-dimensional (3D) printing, and 3) micro-extrusion involving a continuous feed of materials with nano- and micro-scale feature sizes.

Laser ablation is a process of cutting or removing materials from a solid by irradiation with an intense laser beam. Although high-intensity laser radiation can convert a material into a plasma, lower intensity radiation that is absorbed by a material generally causes evaporation and/or sublimation of the solid material. Pulsed lasers (pulses durations ranging from milliseconds to femtoseconds) are frequently applied in laser beam machining; however, continuous wave lasers may also be employed.

By matching absorptive properties of materials to laser wavelength, material may be removed without significantly affecting or even heating surrounding materials, particularly when using short-pulsed lasers. This is particularly useful when laser machining holes, often referred to as "laser drilling." Precision holes of almost any shape may be formed by steering a laser beam (e.g., using MEMS [micro-electro-mechanical systems] based or galvanic-controlled mirrors) or by moving a stage that holds the material being machined relative to a stationary beam.

Additive manufacturing or 3D printing refers to any of a variety of methods used to construct amorphic 3D objects by depositing successive layers of material under computer control. Sophisticated computer-aided design (CAD) programs are used to plan object construction (i.e., printing). Although there can be minor limitations on object form due to intricate structure or the effects of gravity, in general, there are few limitations on the overall shape of a constructed object.

One potential advantage of the systems, apparatus, and methods herein is the ability to precisely position different materials or insertions within a printed object. This may be performed by using separate printer "heads" and/or feeds for each of the different source materials. Most additive manufacturing techniques are amenable to the use and automated ability to select from multiple printer heads and/or material feeds.

More specifically, additive manufacturing using fused deposition involves the extrusion of small beads that quickly harden upon deposition. For example, thermoplastics (e.g., PLA, ABS) may be heated in the region of a nozzle and harden upon cooling following deposition. One or more nozzles may turn on or off the feeding of source materials to control both the geometry and heterogeneous composition of a 3D structure. Fused deposition methods may be used to construct objects made from polymers, plastics, eutectic metals, rubbers, silicones, ceramics, porcelains or clays.

Another additive manufacturing technique that is particularly amenable to the production of heterogeneous materials with programmed functionality is the binding of granular materials. Binding may result from either melting or sintering following the application of directed heat, laser light, or an electron beam. A wide range of metals, alloys, and thermoplastics may be used as base materials using these techniques.

A specific variant of the method of binding granular materials is 3D inkjet printing. Plasters or resins in a powder form (often impregnated with a thermoset polymer) are "printed" in layers using inkjet-like heads. Much like color printing, heterogeneous structures may be formed using multiple inkjet heads in the absence of excessive heating.

Photopolymerization involves the hardening of one or more liquid source materials by (generally ultraviolet) light. Printer systems using inkjets may also employ this methodology where each thin layer that is jetted is cured by exposure to ultraviolet light. A variant of this process involves curing liquids at selected locations using a laser (including more deeply penetrating multiphoton-based lasers) and washing away uncured liquid. These techniques are particularly useful for constructing small and ultra-small (i.e., with feature sizes<100 nm) objects.

Micro-extrusion and/or a continuous feed of materials may be used to produce segments of any length with complex cross-sections involving nano- and micro-scale features. Extrusion may be combined with continuous feed of separate materials (including materials that have been previously extruded) to produce multifaceted cross-sections with different functional regions. It is also necessary to carefully control both the physical and chemical properties of materials during extrusion and continuous feed processes.

SUMMARY

In exemplary embodiments, so-called "smart pins" are constructed using core material(s) that serve to 1) electrically insulate conductive elements placed around the periphery of the pin, and 2) expand in volume following insertion into a hole within an electronic component or circuit substrate. In some embodiments, in circuits with high transition rates (e.g., >1 gigahertz), the dielectric properties of the core material should also be considered. The volume expansion serves to mechanically form permanent electrical and/or thermal connections between any number of conductive elements on the periphery of the pin and corresponding conductive "smart tabs" that line the interior of a hole.

The smart tabs that line the interior of the hole are in electrical continuity with electrical traces or conductive pathways within circuits of a PCB layer or other electrical component. The conductive elements of the pin carry electrical current in the dimension that is normal to the plane of the hole (i.e., commonly referred to as the Z axis) and electrical traces, giving circuit designers truly 3-dimensional, ultra-compact capabilities in circuit designs.

Within descriptions herein, the term "pin" is used as a term to describe a focal component to mechanically affix and electrically connect circuit elements. A pin may also optionally provide a thermally conductive pathway to guide the flow of heat. A pin may be used to interconnect within a PCB or circuit elements. In some configurations, a pin may be designed to mechanically and electrically connect circuit elements that are within separate structures that are adjacent to one another. In this case, the pin performs the function of a "dowel." In yet further configurations, a pin may traverse three (3) or more substrates associated with PCBs, circuit components and the like. In this case, the pin performs functions that can best be associated with the term "rod." In order to describe various functions without substantial repetition, the term "pin" will be used throughout. However, it is understood that a pin of varying lengths may perform functions associated with a dowel or rod.

A pin may or may not include all possible conductive elements. In additional exemplary embodiments, pins may be physically rotated prior to insertion in order to include or exclude one or more conductive pathways along the exterior wall of, or within, the pin. Alternatively, a pin may not be inserted at all. This flexibility allows the capabilities and optional features of circuitry to be modified at the time of device assembly. This, in turn, allows foundational components to be manufactured in bulk without regard to the various configurations and features that may be enabled later during assembly. In this regard, pins allow a degree of "programmability" within circuitry and are thus referred to as "smart pins."

Expanding upon this theme further, active or passive components may be included within pins. At the time of circuit assembly (i.e., when pins are inserted) a choice of components (i.e., from a selection of different pins) may be made. For example, pins may be inserted with different resistance values between two (2) or more pin contacts. These selected (again, at the time of assembly) resistance values may be used as a component of a selection network, including so-called "neural networks".

Resistance values may be chosen based on standard training techniques for neural networks (e.g., back propagation) that are initially implemented in software. Both the training and verification of such networks may be performed within software. Once established, pins with selected resistances may then be inserted to correspond to so-called "weights" or selected degrees of coupling between nodes of a network. Analog implementations of such networks are generally extremely fast and often consume less power than their digital (i.e., software implemented) counterpart. The number of pins inserted for such networks may exceed thousands, or even millions. Such applications lead to references of the pins as "neuro-pins."

Another aspect of the systems, apparatus, and methods herein involves the production and use of so-called "smart tabs" to interconnect conductive surfaces of smart pins to traces on a PCB or contacts within electronic circuit elements (e.g., resistors, capacitors, integrated circuits). By modifying present-day circuit (i.e., electrical trace) design software to take into account the ability to remove substrate without affecting electrical traces, smart tabs may be included or not included (i.e., as needed in circuit designs) at any radial position and/or layer within a hole.

Design software packages most commonly produce so-called Gerber files to guide circuit fabrication. Modifications to design software packages to accommodate smart tabs include the ability to add conductive elements that may effectively be folded into hole regions once substrate is removed. The forms of such conductive elements need to be closely aligned with pin designs.

Smart tabs provide a contact surface within the interior of a hole and may accommodate any size or geometry of holes into which smart pins are inserted. Smart tabs allow the flow of electrical charge within a 2-dimensional surface (i.e., X and Y axes) of a printed circuit to be easily routed in the third dimension (i.e., Z axis), along the long axis of a smart pin.

The net effect of the combination of smart expandable pins and tabs (i.e., a "pin-and-tab" architecture) is the ability to more conveniently and densely design circuitry in all three (3) spatial dimensions. Efficient interconnections of circuits, particularly in the Z axis, allow circuits to be developed with robust, compact, 3-dimensional brick-like and/or amorphic structures. Such freedom in determining the structure of a circuit or even distributed free-form components that make up a circuit allow the embedding of circuitry into structures that simultaneously perform other functions such as clothing, wearable devices, footballs, machinery, computer peripherals, and the like.

Other aspects and features of the present invention will become more apparent from consideration of the following description taken in conjunction with the accompanying drawings.

BRIEF DESCRIPTION OF THE DRAWINGS

A more complete understanding of the present invention may be derived by referring to the detailed description when considered in connection with the following illustrative figures. In the figures, like-reference numbers refer to like-elements or acts throughout the figures. The presently exemplary embodiments are illustrated in the accompanying drawings, in which.

DETAILED DESCRIPTION OF THE EXEMPLARY EMBODIMENTS

Figure 1A:
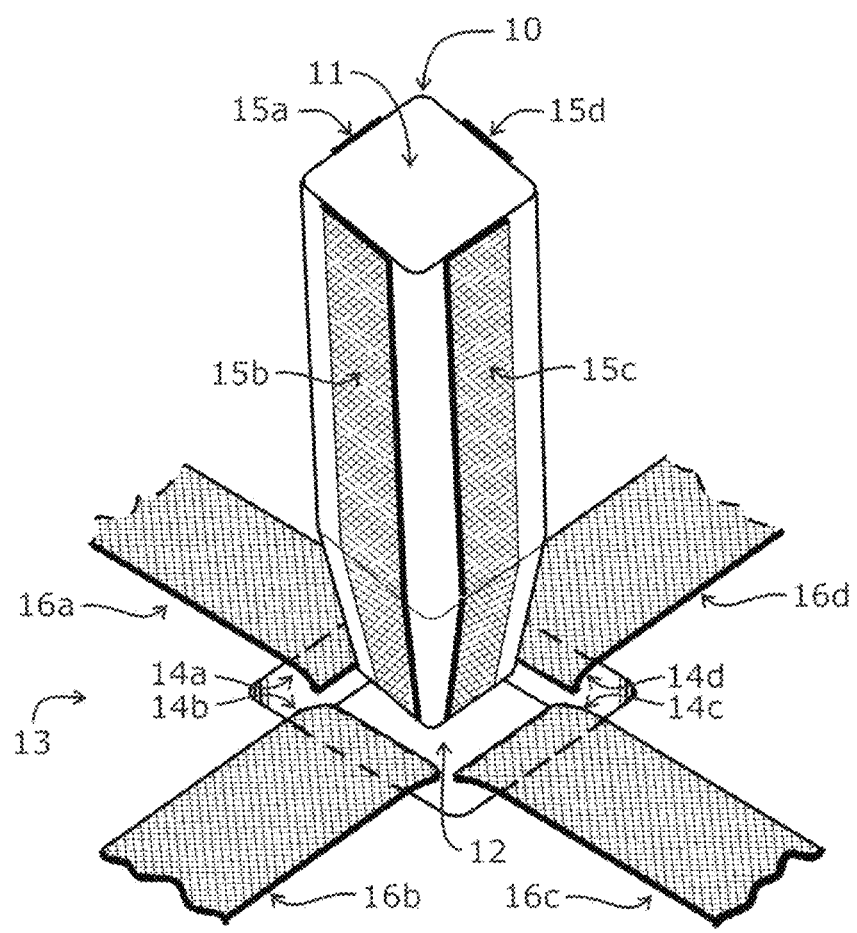
FIG. 1A shows an example of a tapered, 4-conductor, square pin and corresponding hole with tabs (i.e., electrical contacts) within a PCB layer.

In exemplary embodiments, a smart pin is constructed using core material(s) that serve to: 1) electrically insulate conductive elements placed around the periphery of the pin, 2) have desirable dielectric properties to facilitate high-speed (e.g., RF or radio frequency) circuitry, and 3) expand in volume following insertion into a hole within an electronic component or circuit substrate. The outward expansion of core materials serves to mechanically form permanent electrical and thermal connections between the conductive elements on the periphery of the pin and conductive "smart tabs" that line the interior of a hole. Smart tabs that line the interior of the hole are in electrical continuity with traces or conductive pathways within circuits of a PCB layer or other electrical component.

The conductive elements of the pin carry electrical current in the dimension that is normal to the plane of the hole (i.e., Z axis). Complex circuitry may be designed to include many thousands of pins and their associated conductive pathways, giving circuit designers truly 3-dimensional capabilities in high-component-density circuit designs. Pins may be as short as those needed to connect 2 adjacent circuitry layers or, for example, a single circuitry layer to a component embedded within or atop the pin. At the other end of the spectrum, pins may be made sufficiently long to traverse hundreds or more layers of circuitry.

Exemplary embodiments involve the production and use of so-called "smart pins" or "neuro-pins" to interconnect: 1) electrically conductive traces within two or more PCB layers, 2) circuitry within PCB or other circuit substrates to other electronic components including other PCBs, and/or 3) to circuit elements (e.g., resistors, capacitors) embedded within or atop the smart pin. By facilitating electrical conduction pathways in all three spatial dimensions, smart pins result in ultra-compact electronics systems packaging. Such packaging may be of any size or shape with robust embedded three-dimensional circuitry facilitated by smart pins.

In addition, smart pins serve to provide mechanical connectivity and/or thermal conductivity between circuit elements. Connectivity is established by mechanically expanding and/or forcing contacts on pins against electrically conductive tabs on the wall of a hole. Smart pins avoid potentially destructive high temperatures and complex protocols associated with soldering to affix circuit elements. By including or excluding conductive elements within a smart pin or by including or excluding selected smart pins themselves, hardware "programmability" or flexibility is available at the time of device assembly.

Multi-conductor pins facilitate high density connections between PCB and components. Almost all modern-day connections between PCBs and components use system in which single connections are made at single locations on the surface of a PCB. For example, a ball grid array (BGA) may involve one hundred or more tiny balls of solder that must all be simultaneously aligned with an opposing array prior to reflow soldering. After soldering, an x-ray imaging device must generally be used to ensure that continuous connections are formed and that solder from one ball grid elements does not interfere with adjacent elements. By comparison, the connection of 128 separate circuits using 8-conductor smart pins requires the alignment of only 16 pins and no soldering step.

In exemplary embodiments, core materials that may be expanded and have desirable dielectric properties include elastomers, polymers, polyvinyl chloride, plastics and rubber. Processes that may be used to expand such materials, to apply a constant and sustained force at the interface between conductive surfaces on the pin and smart tabs, are described in more detail below.

In additional embodiments, plasticizers may be added to core materials to add high rebound properties to the pin, ensuring the constant contact pressure within the hole. By far the most common plasticizer used in the plastics industry is polyvinyl chloride (PVC). It is generally believed that plasticizers work by embedding themselves between chains of polymers, spacing them apart to increase pliability, including at low temperatures. Plasticizers do not interfere with the desirable dielectric properties of most plastics and polymers, and are thus used in insulators that surround electrical transmission cables. Other plasticizer additives include phthalate ester, sebacates, adipates, terephthalates, dibenzoates, gluterates, phthalates, azelates and a wide range of esters.

Turning to the drawings, FIG. 1A illustrates the insertion into a hole 12 within a PCB layer 13 of one of one of the more particularly useful exemplary embodiments of a smart pin, a 4-conductor square pin 10. The hole 12 contains four (4) smart tabs 14a, 14b, 14c, 14d that align with 4 conductors 15a, 15b, 15c, 15d on the surface of the pin 10. The 4 smart tabs 14a, 14b, 14c, 14d that line the walls of the hole 12 are, in turn, in electrical continuity with 4 conductive "traces" or electrical pathways 16a, 16b, 16c, 16d on the surface of the PCB layer 13.

The taper at the bottom of the pin 10 helps to align the pin 10 in the plane of the PCB layer 13 as it is inserted into the hole 12. Additionally, the taper coupled with the corners of the pin that fit with corresponding corners of the hole 12 help to align the pin rotationally during the insertion process. Following insertion into the hole 12, expansion of the pin core material 11 that also serves to insulate the 4 conductors 15a, 15b, 15c, 15d around the perimeter of the pin 10 causes firm electrical contact between the 4 conductors 15a, 15b, 15c, 15d on the pin surface and their corresponding tabs 14a, 14b, 14c, 14d that line the walls of the hole 12.

Figure 1B:
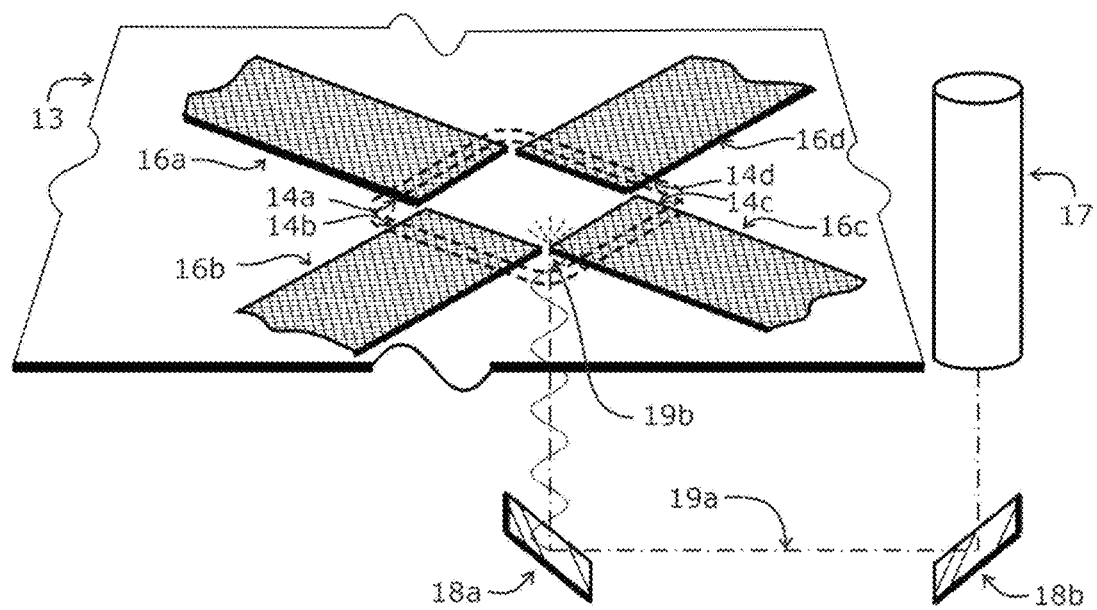
FIG. 1B shows the removal of substrate below conductive traces within a PCB layer to form a hole using laser ablation.

FIG. 1B illustrates the formation of a hole within a PCB layer 13 using laser 17 ablation. A high-intensity laser 17 beam 19a, 19b is steered in X and Y directions (i.e., in the plane of the PCB layer) toward a PCB substrate 13 containing conductive traces 16a, 16b, 16c, 16d using beam steering mirrors 18a, 18b. Ablation of substrate 13 material occurs at the point 19b the beam 19a hits the substrate 13. By controlling beam properties and steering 18a, 18b the beam, substrate 13 may be removed without affecting electrically conductive traces 16a, 16b, 16c, 16d atop the substrate 13. Traces that are atop the newly formed hole 14a, 14b, 14c, 14d may be folded down into the hole 12 as shown in FIG. 1A to form smart tabs.

The use of smart pins and tabs may be used simultaneously (i.e., formed with the same or similar equipment and techniques) as more traditional "drill and fill" techniques where formed holes may simply be filled with a conductive material to electrically (and thermally) make connections between adjacent layers. Although smart- or neuro-pins generally provide designers with greater flexibility to form compact designs, is some regions of some circuits, simple connections between adjacent layers may be sufficient.

Figure 2A:
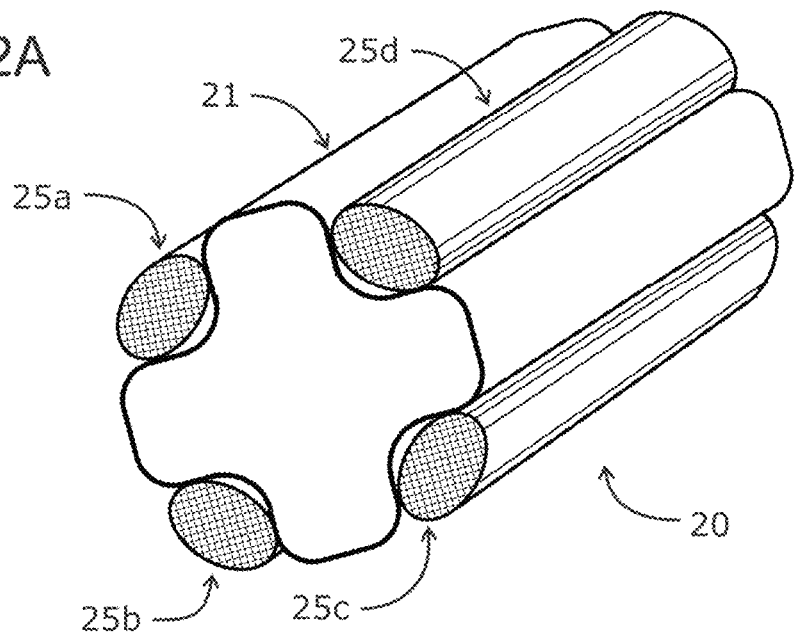
FIG. 2A shows a smart pin segment illustrating the extruded shape of an insulator separating 4 embedded, elliptically-shaped conductive wires.

FIG. 2A illustrates the foundational assembly of a segment of a pin 20. The pin 20 is composed of a non-electrically conductive (i.e., insulating) core material 21 that may be expanded in dimension following insertion into a hole within a PCB or electronic component. In an exemplary embodiment, the insulating material 21 may be extruded (i.e., more specifically, micro-extruded) to control cross-sectional shape. Assembly of the pin also involves placing one or more conductive segments around the perimeter of the core material 21. FIG. 2A shows 4 conductive wires 25a, 25b, 25c, 25d with elliptical cross-sections partially embedded within the insulating core 21. The combination of an elliptical shape of the wires 25a, 25b, 25c, 25d coupled with concave regions within the insulating material to receive the wired, help maintain a roughly circular cross-section for the style of pin illustrated in FIG. 2A.

Figure 2B:
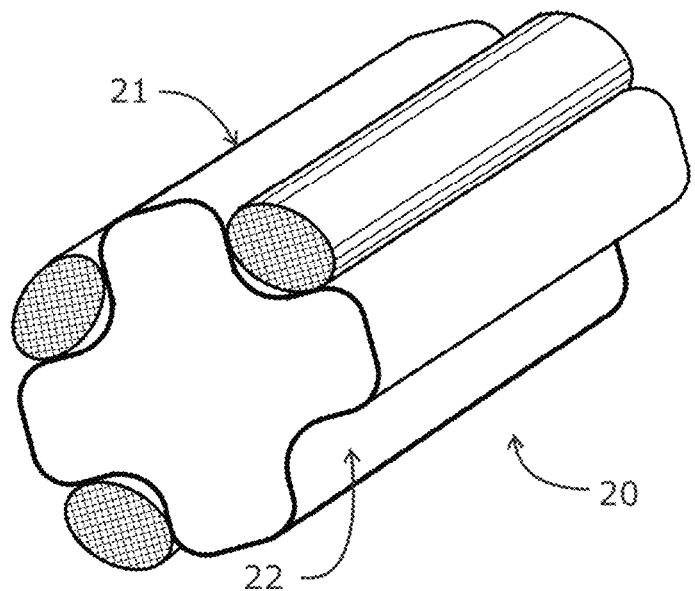
FIG. 2B illustrates the assembly of a smart pin segment in which one conductive element has been intentionally excluded to afford circuit "programmability" during PCB assembly.

FIG. 2B illustrates a segment of a pin, similar to that shown in FIG. 2A, except that one of the conductors has been excluded from the assembly process. This leaves a void 22 where a conductor could have been placed within the pin segment. The intentional inclusion or exclusion of one or more conductors within a pin allows a degree of "programmability" of circuitry at the time of assembly. When conductive elements are excluded, circuits associated with any voided location 22 are not completed. By including or excluding conductive element, distinct functionalities may be enable or disabled within a device. In rare cases, no conductors may be included within a pin. In this case, a pin may still be used simply for structural or mechanical support.

Figure 3A:
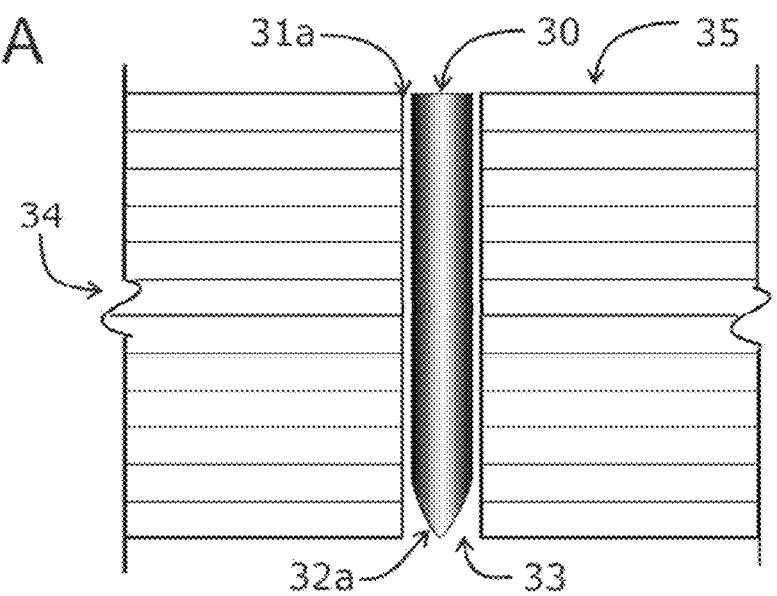
FIG. 3A shows the insertion of a tapered pin traversing multiple layers within a PCB.

FIG. 3A is a sectional view illustrating the insertion of a pin 30 into a hole 33 within a multi-layered 34 PCB or electronic component 35. A tapered end 32a on the pin helps to align the pin 30 within the hole 33 during the insertion process. The pin is 30 initially sized, prior to and during the insertion process, to have a slight gap 21a between the pin 30 and the walls of the hole 33 to allow the pin 20 to be inserted without damage to either the pin 30 or the hole 33. The pin 30 is of sufficient length to traverse any selected number of layers 34 of the PCB or electronic component 35.

Figure 3B:
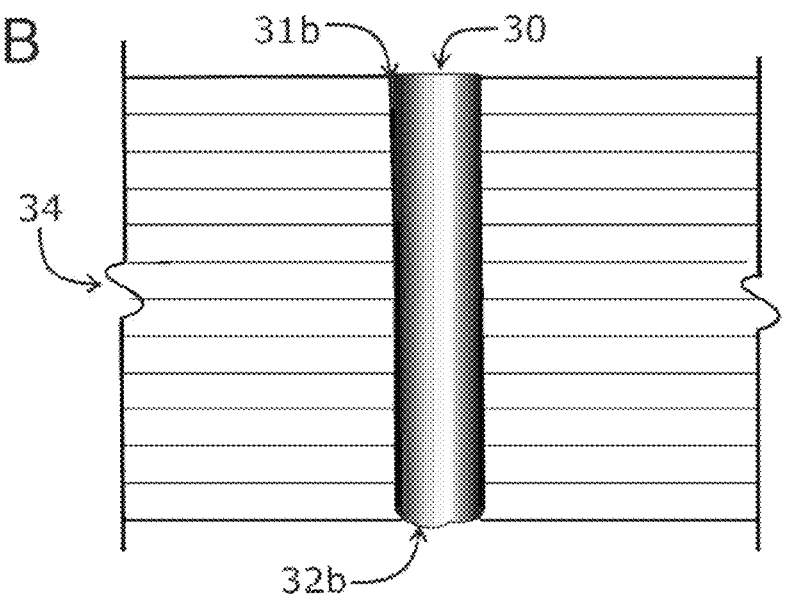
FIG. 3B illustrates secure contact with the walls of a hole following smart pin expansion.

FIG. 3B illustrates the same pin 30 as in FIG. 3A securely affixed following pin expansion. Both the gap 31a between the pin 30 and the wall of the hole 33, and the region around the pin taper 32a are filled during the pin expansion process, leaving no gap 3 lb or taper 32b. Expansion forces any electrically conductive elements on the pin 30 against electrically conductive elements at the same rotational position on the wall of the hole. Expansion is confined by the dimensions of the hole 33 within the PCB or electronic component 35.

An exemplary embodiment for pin expansion is the extrusion of pin core material directly into a hole. Simultaneously, conductive elements may be added around the pin periphery during the continuous formation and extrusion of the pin core. Expansion of extruded material occurs naturally in most materials since the extrusion process itself applies large forces, causing material compression, prior to flow through an extruder. In the art, polymers and plastics undergo so-called "die swelling" (i.e., expansion) before curing. The degree of swelling is characterized by a so-called "expansion ratio" that is dependent on polymer or plastic chemistry as well as other factors such as nozzle temperature and extrusion pressure. Typical expansion ratios, in the order of 1.5, are more than sufficient to fill any gap 31 (i.e., just sufficient to allow pin insertion) between a pin 30 and the wall of a hole 33 as well as the region around the pin taper 32a as depicted in FIG. 3B.

The expansion of a pin may involve the expansion of one or more: 1) insulating or 2) conducting materials that comprise the pin, or both. If, for example, only insulating material is made to expand, its expansion applies radial force to press together conducting pathways on the periphery of the pin with the conductive tabs that line the hole. It is also possible to separately include materials within the pin selected specifically for expansion properties embedded within materials that are selected for their dielectric properties.

In additional embodiments, so-called "foaming agents" may be included within pin materials to produce expansion. Foaming agents use a "blowing agent" to produce a gas within a liquid and a surfactant that reduces surface tension to increase the ability of the gas to produce small bubbles within foam. Common gases produced by blowing agents include carbon dioxide, pentane and chlorofluorocarbons. Common blowing agents that produce gas upon reacting with water include sodium bicarbonate, azodicarbonamide and isocyanates.

More specifically, and as an exemplary embodiment within the category of pin expansion using foaming agents, "closed cell foam" may be produced as a uniform, high-density foam that may become extremely hard (producing robust electrical contacts) upon curing. Polyethylene, polyurethane, polystyrene, neoprene and polypropylene are examples of closed-cell foaming agents. Polyurethane may be used to produce a particularly hardened and chemically resistant pin upon curing.

Another exemplary embodiment involves stimulating a chemical reaction within pin core materials that results in pin expansion. Many of the chemical reactions are the same as, or similar to, the foaming agents just described. However, chemical reactions or catalyzation are delayed until an external stimulus is applied. Most commonly, the stimulus is heat, although triggers may be used. The heating of a specific pin following insertion may be performed in a number of ways including the application of infrared radiation (e.g., using a laser) or focused ultrasound.

Alternatively, all pins may be cured simultaneously by a gentle (particularly when compared with soldering) overall heating of circuitry (i.e., the entire device). Overall heating may be applied in a number of ways including radiant heating, wide-field ultrasound, and the like. In addition to ultrasound, the application of compression waves may be applied over a range of other frequencies (e.g., audio, ultra-low frequencies) that may also be used, for example, to promote mixing of expansion agents and/or to break apart encapsulated catalyst agents. Along similar lines, there is no necessity to restrict application of electromagnetic radiation to a frequency range around the infrared spectrum. For example, radio and microwave frequencies (e.g., 10-100 megahertz) may be used to heat polar molecules such as water that may, for example, be contained in a foaming agent. Another alternative is the use of a blowing agent catalyst (e.g., a tertiary amine). The catalyst may be applied around pins such as those depicted in FIG. 20.

Yet another exemplary method to enact pin expansion following insertion involves cooling the pin prior to insertion. For example, a pin segment may be drawn through liquid nitrogen (or almost equivalently, liquid air) that boils (i.e., turns into gas) at approximately −195° C., or run through a stream of rapidly expanding compressed gas just prior to insertion. Upon insertion, the pin returns to typical room temperatures that is accompanied by a thermal expansion that is a property of almost any material that might be used to construct a pin.

An alternative exemplary method to force contact between conductors on the pin and conductive surfaces that line the hole involves the softening of core material during the insertion process by heating or the use of a plasticizer, and forcibly inserting the softened material into the hole. In these cases, any hole that is open on the bottom requires a "stop layer" to seal the hole, as described below. The force used during insertion forces conductive surfaces together. The pin is then re-hardened by cooling or chemically reversing the effects of the plasticizer.

Figure 4:
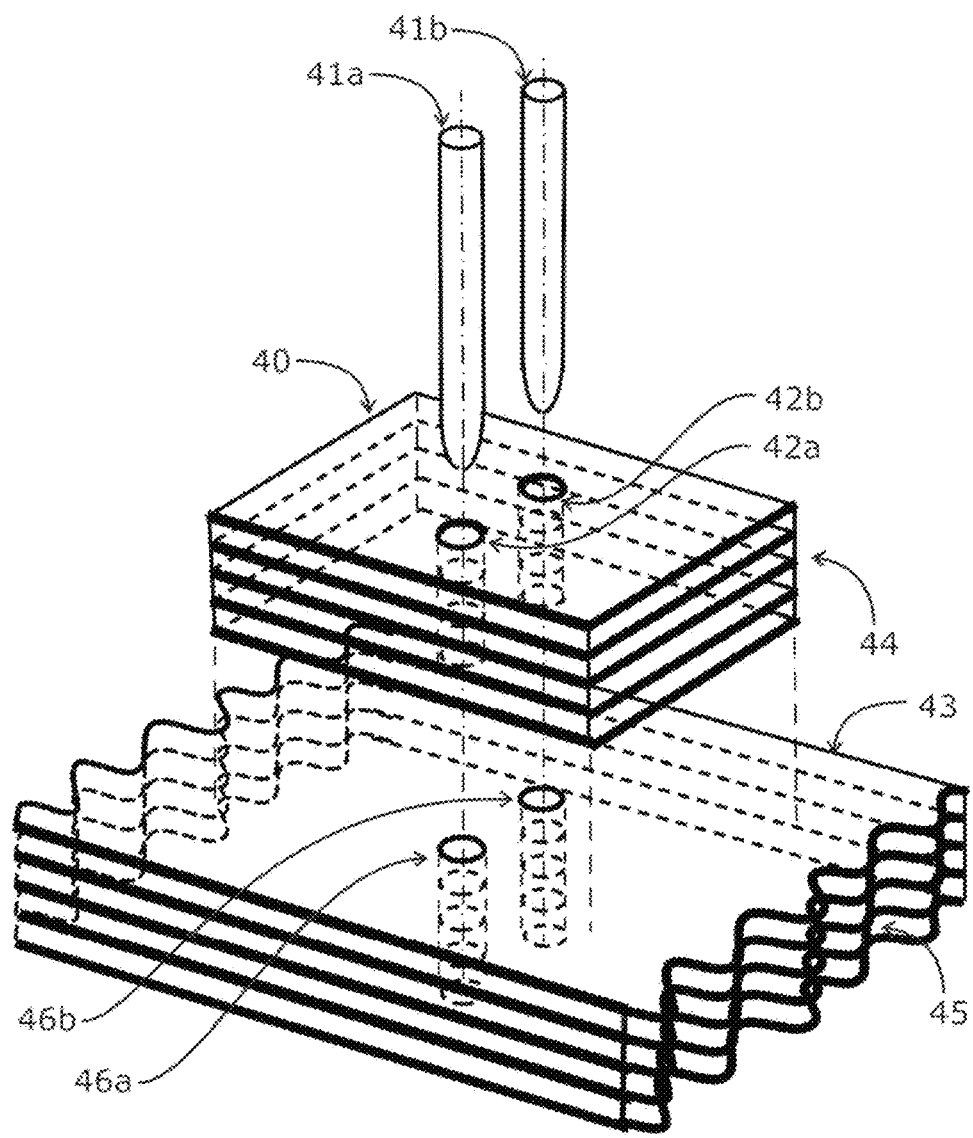
FIG. 4 shows a component affixed atop a multi-layered PCB using smart pins.

FIG. 4 illustrates the mounting and electrical interconnection of an electronic component 40 atop a multi-layered PCB 43 using two smart pins 41a, 41b. The two pins 41a, 41b traverse holes 42a, 42b within all layers 44 of the component 40 as well as corresponding holes 46a, 46b that cross several layers 45 of the multi-layered PCB 43. The pins 41a, 41b may include one or more conductive elements that may be used to electrically interconnect any conductive surface(s) within the electronic component 40 and/or the PCB 43. Examples of components that may be mounted and electrically interconnected in this fashion include resistors, capacitors, switches, diodes, transistors, light-emitting diodes, memory elements, sensors, connectors, integrated circuits, arrays of components (e.g., resistors, transistors, diodes) and other PCBs.

Figure 5A:
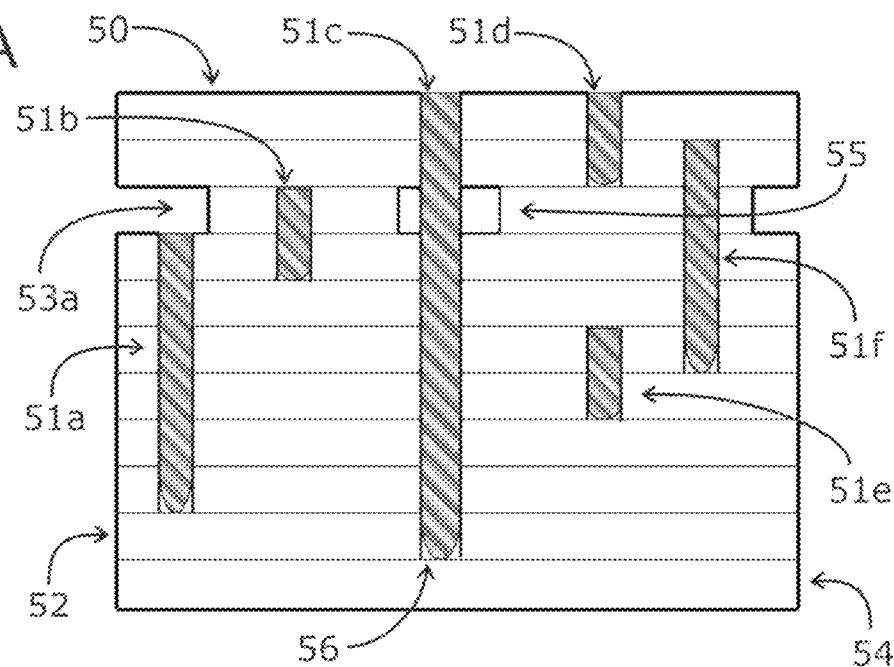
FIG. 5A shows a cross-sectional view of a multi-layered PCB that contains smart pins of varying lengths and positions within the PCB.

FIG. 5A shows a sectional view of a multi-layered PCB 50 that contains a number of smart pins 51*a*, 51*b*, 51*c*, 51*d*, 51*e*, 51*f* of varying sizes and locations. The sectional view illustrates pins of varying lengths from those that simply traverse two substrate layers 51*b*, 51*d*, 51*e* within the layers 52 of the PCB 50, to those that traverse most or all 51*c* of the PCB layers 52. Some pins 51*c*, 51*d* reach the surface of the PCB 50 while others 51*b*, 51*e*, 51*f* are completely buried or embedded within the final device assembly. FIG. 5A also illustrates how shorter pins may even be placed atop one another (i.e., in the same positions within different substrate layers) 51*d*, 51*e* to make circuitry more compact (i.e., occupying less volume).

As also exemplified in FIG. 5A, layers 53*a* or portions of layers within a PCB 50 may be devoted to components. Such component layers 53*a* are particularly effective and compact if components are of a consistent height. This allows components to be mounted without excessive cut-outs or varying the number of spacing layers to accommodate differing heights of buried components. Smart pins may terminate 51*a*, just reach 51*b* or completely traverse 51*c*, 51*f* a component layer 53*a*. The placing and size of components has the potential to leave some voids 55 within a component layer 53*a*.

FIG. 5A also illustrates the use of a so-called "stop layer" 54 within a PCB 50. The stop layer 54 may be used to both 1) limit the travel of a smart pin during the insertion process, and 2) limit the volume of any pins that reach the first PCB layer during the pin expansion process. The inserted tip 56 of a pin 51*c* is limited by a stop layer 54.

The stop layer 54 may be removed once all pins are expanded, or the stop layer 54 may be retained within the overall PCB 50 for circuit protection from abrasion or other mechanical abuse on the associated side(s) of circuitry. In fact, it is possible to design circuitry with protective layers and/or the absence of active circuitry for some distance on all sides of a 3-dimensions circuit assembly. Such circuits may be securely held together by buried smart pins and adhesives. With the advent of wearable computing and the increased placement of electronic circuitry in harsh environments (e.g., military, space), it is increasingly important to build electronically and mechanically robust devices that may withstand rough treatment.

Figure 5B:
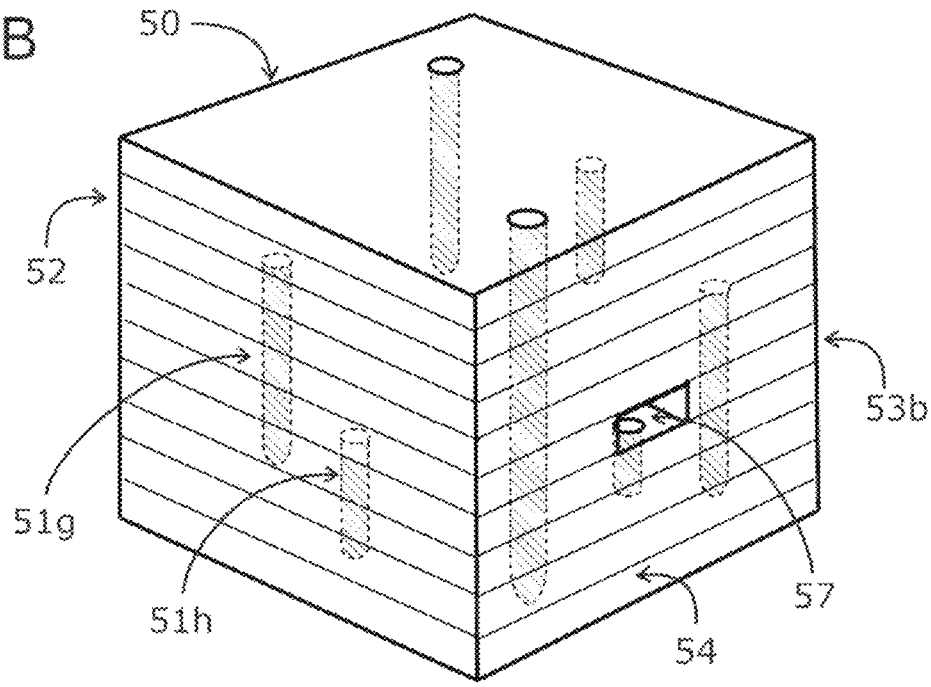
FIG. 5B shows a 3-dimensional perspective view of smart pins positioned within a multi-layered PCB.

FIG. 5B shows a 3-dimensional perspective drawing of the positioning of smart pins (e.g., 51*g*, 51*h*) within a multi-layered 52 PCB 50 cube. The stop layer 54 has been retained in this particular PCB assembly 50. FIG. 5B also illustrates a component layer 53*b* in which a void 57 in the component layer 53*b* is exposed to the external environment. Voids exposed to the external environment 57 may be coincidental, or purposefully included by device designers. Such voids 57 may be useful to allow for device cooling via airflow (or any other fluid in the environment of the device), internal sensors that sample the environment, or convenient places to mount cabling or other connectors (along with strain relief) to interconnect with other devices.

Figure 6A:
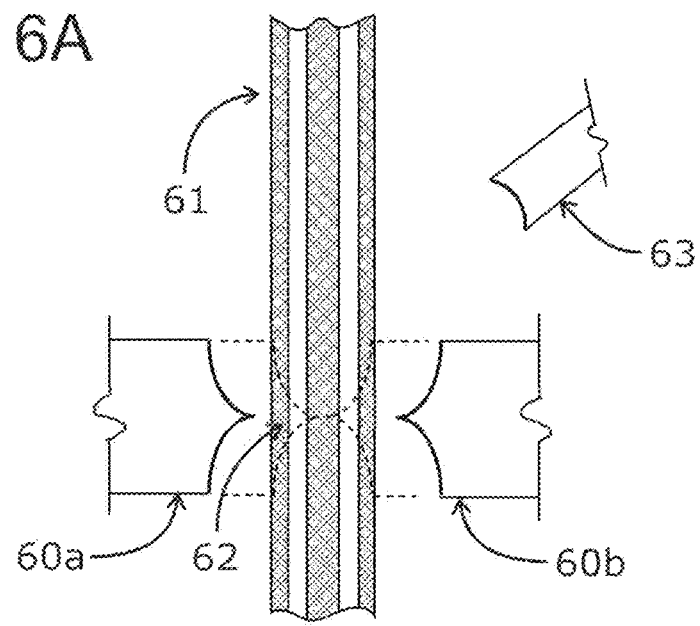
FIG. 6A illustrates the cutting of a smart pin and formation of a taper using a knife edge or press.
Figure 6B:
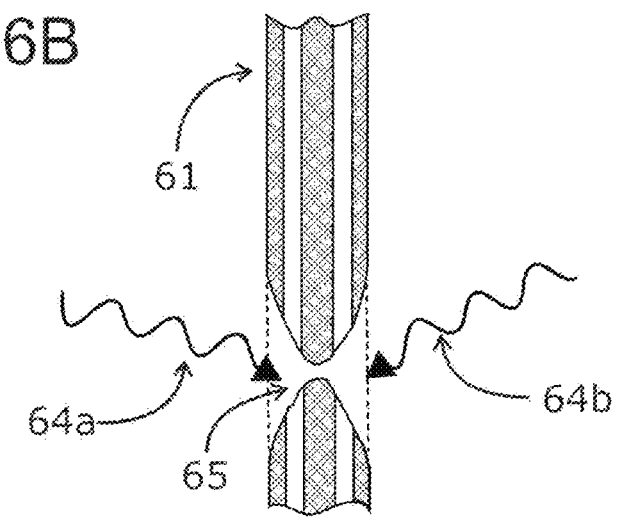
FIG. 6B illustrates the cutting of a smart pin and formation of a taper using laser ablation.

FIGS. 6A and 6B show exemplary methods to segment or sever pins 61, serving to controlling pin length and producing a short taper. The taper functions to spatially align pins when they are inserted into receiving holes or conversely, to align components containing holes when positioned onto one or more protruding pins.

FIG. 6A illustrates mechanically cutting the end of a pin 61 using knife edges or a press 60*a*, 60*b*. The taper and angle of the cutting edges or press 60*a*, 60*b* are used to control the taper of the pin 62. A taper 62 may be applied to both pin segments (as shown) or only one pin segment, cutting the other segment flat (not shown). Cutting edges 60*a*, 60*b* may close together fully against a pin 61 from two or more sides simultaneously. Alternatively, any number of partial cuts may be made from two or more directions followed by a severing cut using two or more knife edges 60*a*, 60*b* oriented in opposite directions. As exemplified in the insert showing a top-view of a knife edge 63, initial cuts may also use cutting edges that are curved to accommodate the contours (e.g., round, rectangular, square) of pins 61.

FIG. 6B illustrates the use of one or more lasers to sever a pin 61. Laser radiation ablates the material near the end of a pin 61 in a manner that produces a taper 65 (i.e., rounded in the example of the pin shown in FIG. 6B). The shape of taper may be controlled by the angle and spot size of the laser light 64*a*, 64*b* as well as the wavelength of the electromagnetic radiation that, in turn, controls the penetration of the laser energy into the pin 61.

Figure 7:
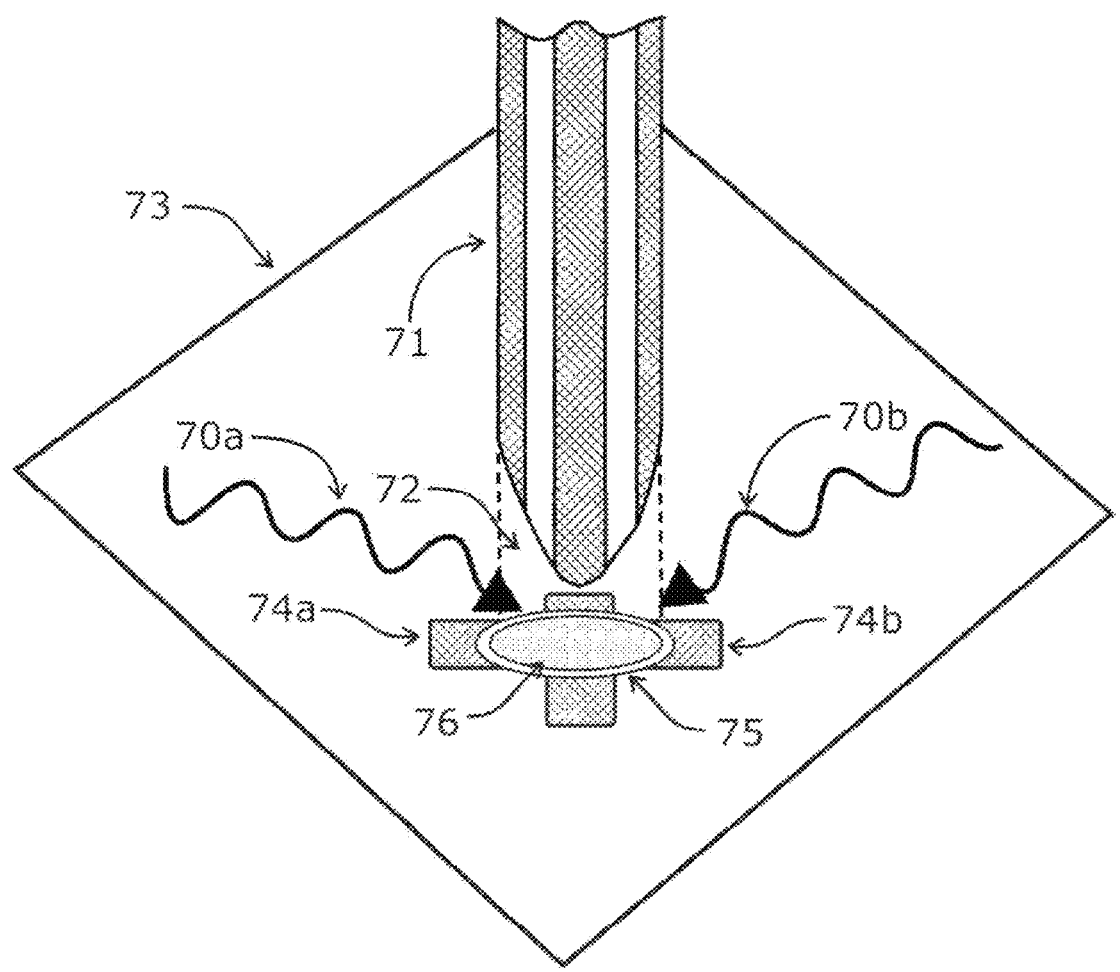
FIG. 7 illustrates the cutting of a smart pin to a desired length in situ and the simultaneous forming of a taper for the next pin to be extruded.

FIG. 7 illustrates the use of laser ablation to sever a pin 76 in situ (i.e., after positioning within a PCB or electronic component 73) and to simultaneously taper the pin 71 in preparation for insertion into the next hole. A pin segment 71 is initially inserted in a hole 75 within a PCB layer 73 that contains any number of smart tabs and associated traces 74*a*, 74*b* that, in turn, make up a portion of an electronic circuit. Once the pin segment 71 is positioned within the terminal layer that the particular pin traverses 73, electromagnetic radiation 70*a*, 70*b* from a laser is used to sever the pin segment, exposing the top of the inserted pin 76 and tapering the severed end 72 of the pin segment 71 in preparation for insertion into the next hole. All pins that terminate within a given layer 73 are severed prior to the assembly of the next layer.

Figure 8:
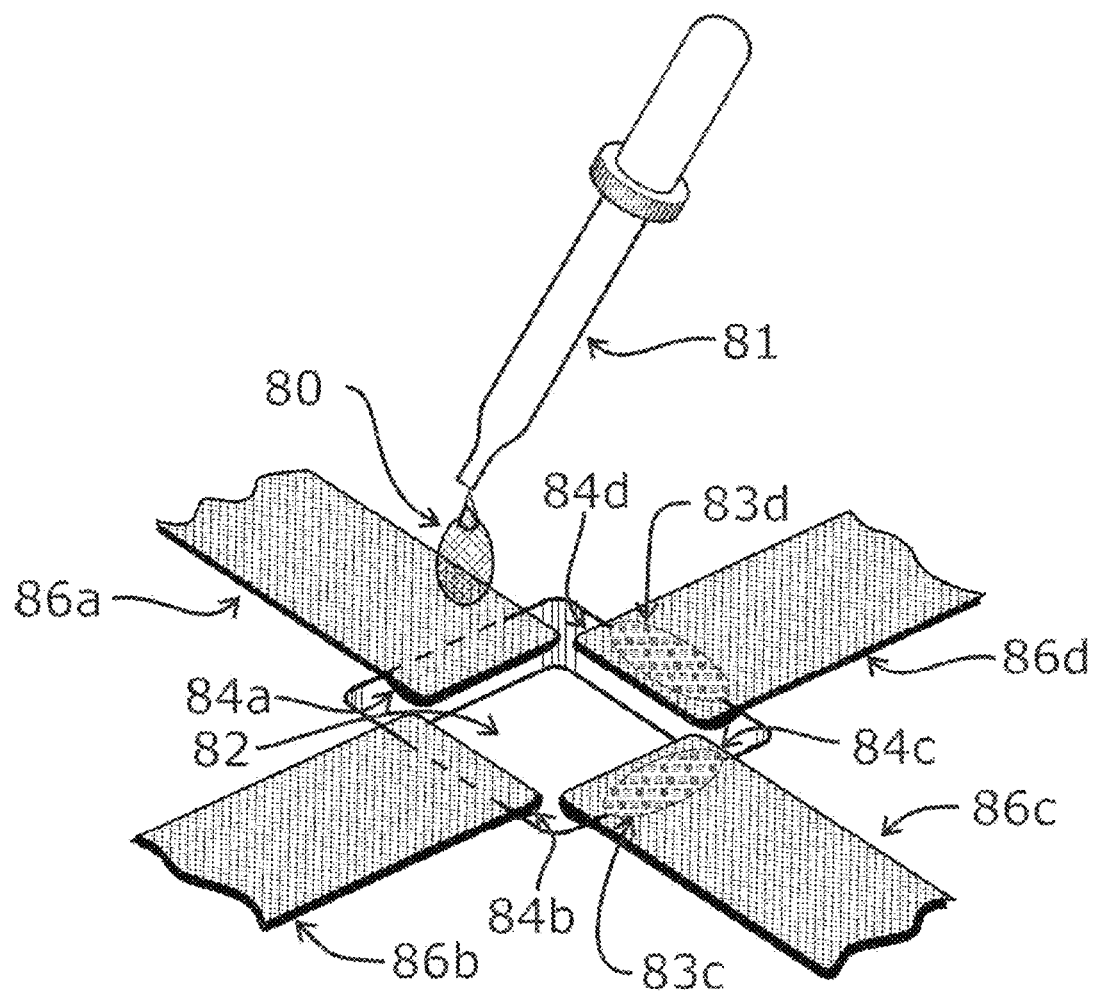
FIG. 8 illustrates the application of a drop of material in the region around the fold of a smart tab to allow slippage of the pin during insertion, reduce electrical contact resistance and/or to subsequently strengthen the tab fold.

FIG. 8 illustrates the application of a material (e.g., liquid flux) 80 that allows slippage during pin insertion and/or strengthens the region in the vicinity where tabs 84*a*, 84*b*, 84*c*, 84*d* fold over the edge of a hole 82. Smart tabs 84*a*, 84*b*, 84*c*, 84*d* must maintain electrical continuity with current-carrying traces 86*a*, 86*b*, 86*c*, 86*d* on the PCB or other electronic component. In the snapshot shown as FIG. 8, fluid 83*c*, 83*d* has been applied to two of the four tabs 84*c*, 84*d* and a drop 80 is in the process of being applied to the third tab 84*a*. Drops are dispensed from one or more high rate micro dispensers 81. The material 80 is applied in liquid form when it may help pin insertion by allowing the sides of the pin to slip past smart tabs. Upon hardening, the material may also strengthen the edges of the tab as they fold over the sides of the hole 82 and/or improve conductivity between conductive layers on the pin and their corresponding tabs.

Similar to modern-day fluxes, the material deposited on smart tabs just prior to insertion plays multiple roles. Modern-day fluxes clean surfaces (most commonly by removing oxides and other contaminants), act as a flowing agent during soldering processes and serve to purify by acting as a reducing agent to prevent oxides from forming. These fluxes are composed of vehicles (e.g., abietic acid, pimaric acid and other resin acids), activators (e.g., zinc or aluminum chloride), solvents (particularly in liquid fluxes) and additives (e.g., surfactants and plasticizers).

Two additional roles for the material deposited on smart tabs include: 1) reducing friction to allow slippage of the smart pin during the insertion process, and 2) hardening following insertion to help secure stable electrical contact, particularly in the "fold" (i.e., over the lip of the hole) region of the smart tab. By controlling the relative amounts of resin acids and solvents, modern-day fluxes are available in a range of forms from liquid to semi-solid pastes. An intermediate between liquid and solid helps pin insertion by facilitating slippage. Many modern-day fluxes also naturally harden (particularly upon modest heating), generally as a result of the evaporation of solvents. Thus, although additional hardening agents may be included in deposited materials within additional embodiments, this function is also met by existing fluxes.

In additional and alternative exemplary embodiments, one or more similar materials may be applied to the conductive pathway elements on the surface of the pin. The material may perform one or more of the same or similar functions as materials applied to the tabs: 1) to reduce friction during pin insertion, 2) act as a flux to reduce electrical resistance, and 3) harden following insertion to mechanically strengthen pin-tab contacts.

Figure 9A:
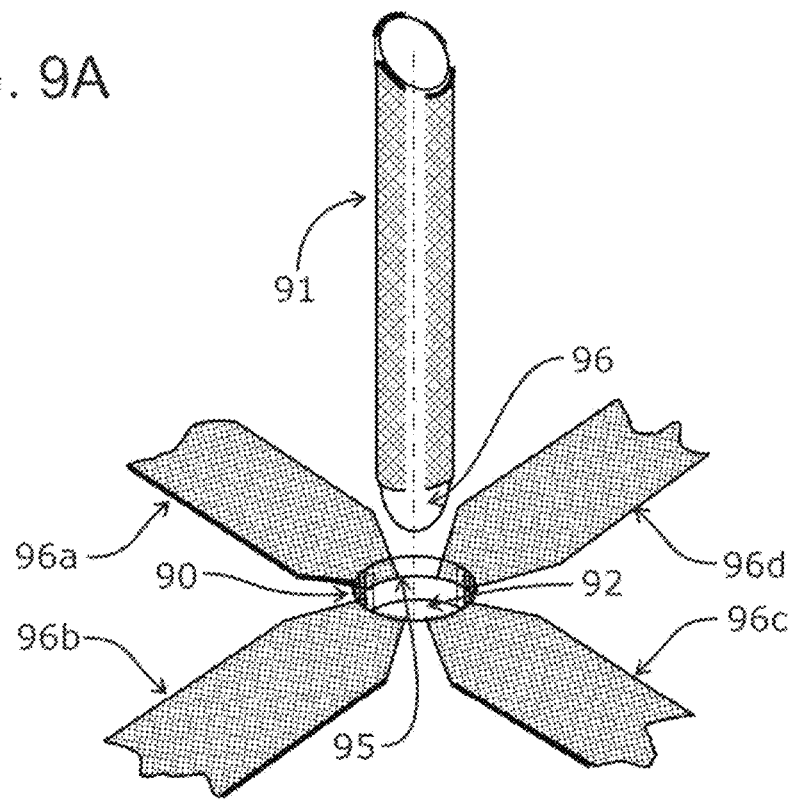
FIG. 9A illustrates insertion and tab formation for a 4-conductor, round pin with conductive elements associated with one PCB layer removed from the pin.

FIG. 9A shows a 4-conductor, round pin 91 being inserted into a round hole 92 with 4 smart tabs and associated PCB traces 96a, 96b, 96c, 96d. The tabs are folded over the edge 90 of the hole 92 to the level of a single PCB layer 95 within a multi-layered PCB or electronic component. This allows other layers within the PCB or component to project additional tabs into the same hole 92 without affecting the ability to insert a tightly spaced pin 91 through multiple layers.

Additionally, as illustrated in FIG. 9A, electrical conductors have been excluded from the bottom level 96 of the pin 91 such that any tabs projected into the hole 92 at associated level(s) do not generate electrical pathways via the pin 91. Similar to the "programmability" enabled by pins described in FIG. 2B, this selective exclusion of conductive material around the perimeter of the pin 96 allows flexibility in determining which circuits are enabled at the time of device assembly.

Figure 9B:
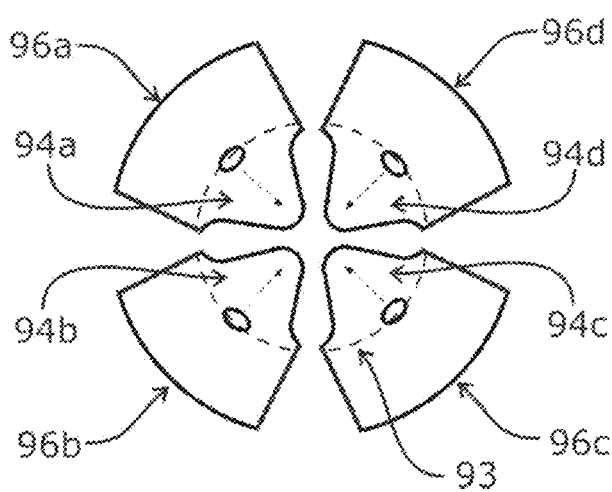
FIG. 9B illustrates a tab formation that maximizes contact area for a 4-conductor, round pin.

FIG. 9B illustrates a cut-and-fold pattern that maximizes the depth and contact surface area of tabs 94a, 94b, 94c, 94d in a 4-conductor, round hole. Looking down onto the hole, 4 PCB traces 96a, 96b, 96c, 96d cover an area in which substrate has been removed (e.g., by laser ablation) where the edge of the hole is indicated by a circular dashed line 93. The roughly triangular shape of individual traces or tabs 94a, 94b, 94c, 94d that fold into the hole during pin insertion maximizes the contact area with conductive materials on the surface of the pin (absent the deposition of any addition conductive materials within the hole).

Figure 10A:
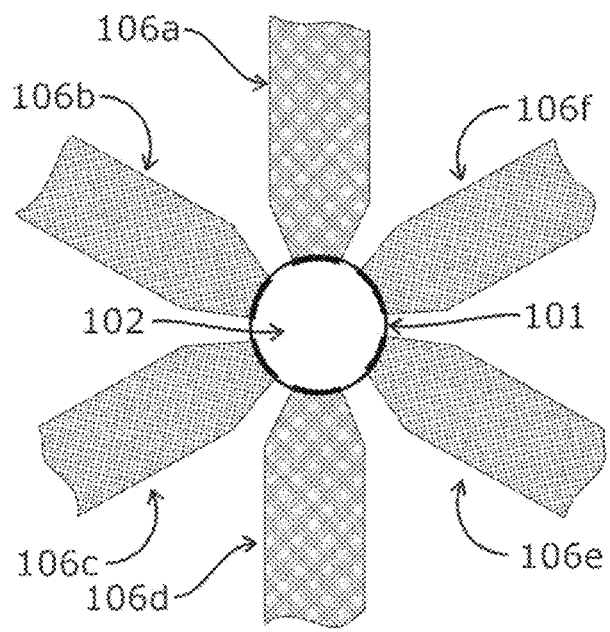
FIG. 10A illustrates a pattern of conductive traces for a 6-conductor round hole.

FIG. 10A shows a pattern of six conductive traces 106a, 106b, 106c, 106d, 106e, 106f electrically connected into a round hole 102. Round holes may be easier to manufacture using mechanical drilling techniques; however, when traces 106a, 106b, 106c, 106d, 106e, 106f are folded over the edge of the hole 101, slight wrinkles may occur in the conductive traces at the edges due to the curvature of the edge of the hole 101.

Figure 10B:
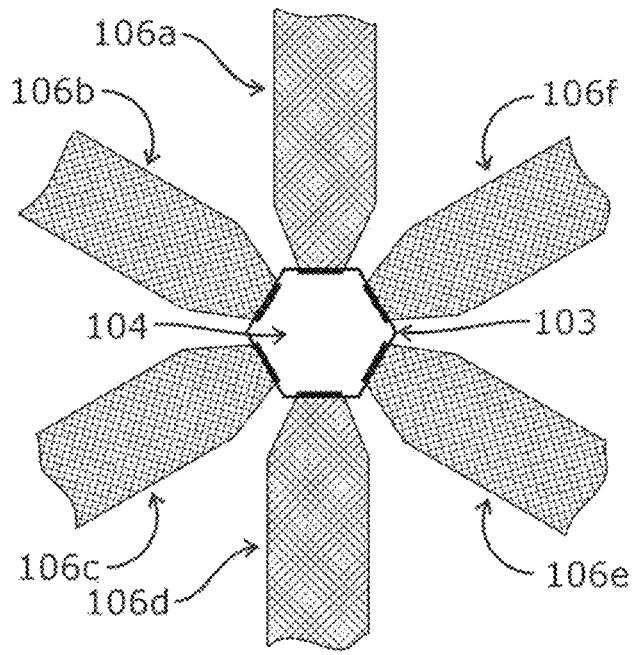
FIG. 10B illustrates a pattern of conductive traces for a 6-conductor hexagonal hole.

FIG. 10B shows a similar pattern of six conductive traces 106a, 106b, 106c, 106d, 106e, 106f electrically connected into a hexagonal hole 104. When bent over the straight edges 103 of the hexagonal hole 104, right-angle bends in the conductive traces 106a, 106b, 106c, 106d, 106e, 106f may be formed wrinkle-free, reducing chances for breaks or buckles in the conductive tabs as a pin is inserted.

Figure 11:
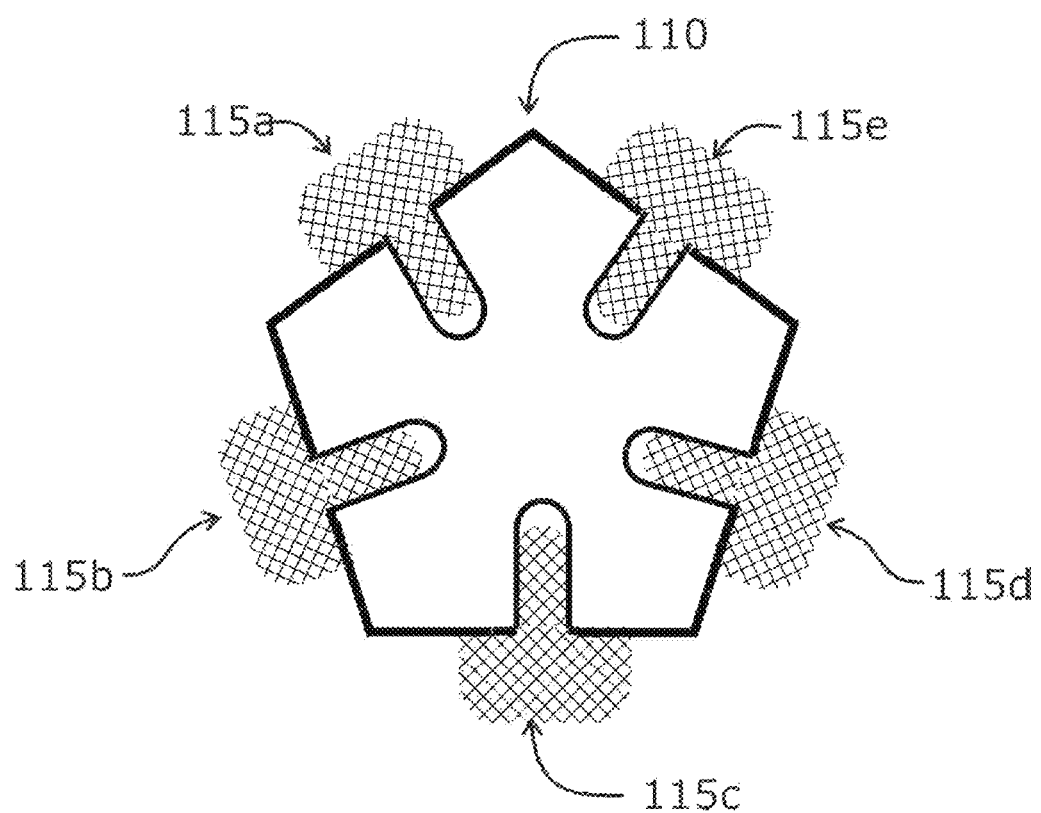
FIG. 11 shows the cross-section of a pentagonal pin structure with T-shaped conductive elements that are partially embedded in the core insulator.

FIG. 11 shows a cross-sectional view of a pentagonal pin structure. T-shaped conductive structures 115a, 115b, 115c, 115d, 115e are partially embedded in the core insulator 110. This structure provides mechanical support for the conductors 115a, 115b, 115c, 115d, 115e as the overall pin is extruded, micro-assembled and inserted into holes. In addition, compared with a conductive ribbon on the surface of the pin, the increased cross-sectional area of T-shaped conductive elements provides a reduced resistance to the flow of charges along the pin.

Figure 12:
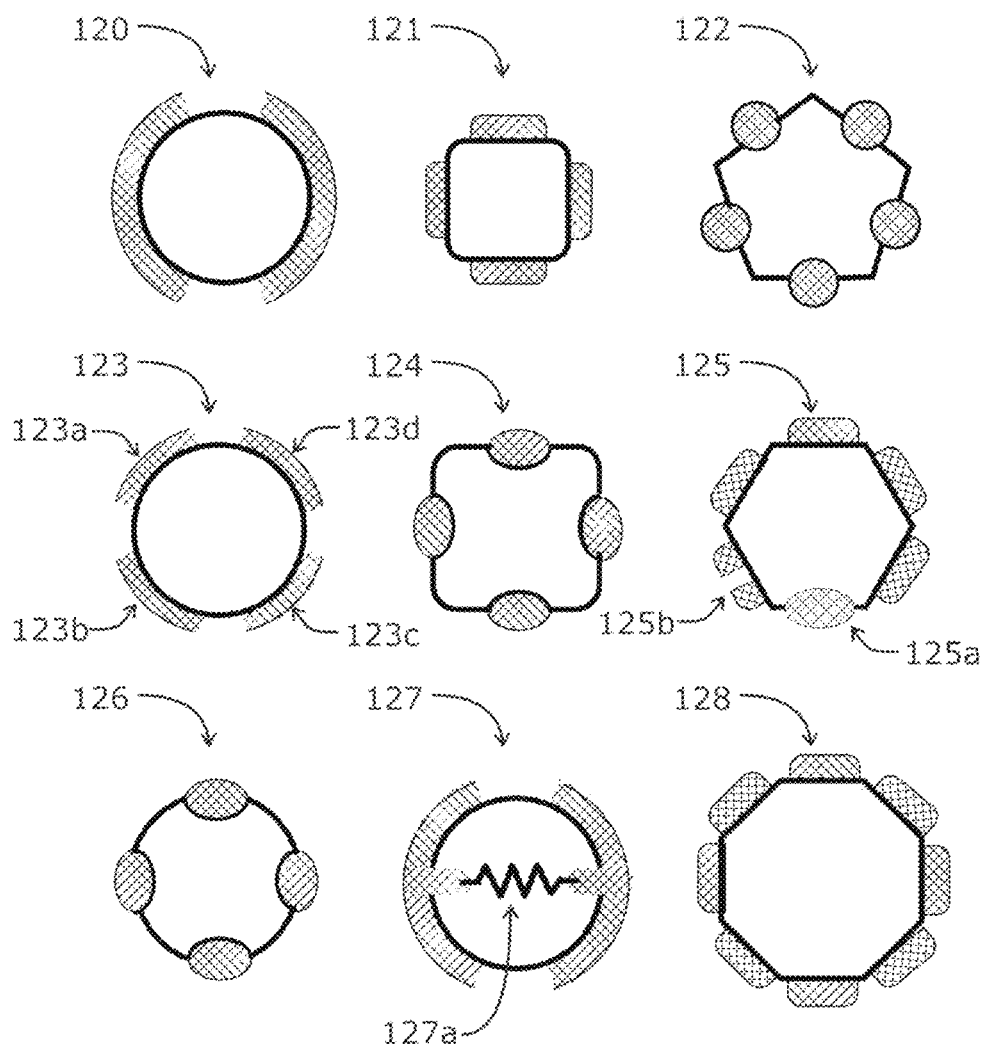
FIG. 12 illustrates a variety of features within cross-sectional views of various pin structures.

FIG. 12 shows nine cross-sectional views 120-128 to demonstrate exemplary features of exemplary pin structures. In each example, the edge of the insulating, expandable core is shown as a solid line (prior to expansion). Conductive elements along the periphery are show as filled structures. Pin conductive elements are aligned with conductive elements of holes within PCB or electronic components that corresponding to the size and shape of the illustrated pin.

Pins may have only 2 conductive elements in a so-called "drum brake" design 120. By comparing the conductive elements of the drum-brake design 120 with a similarly-sized and shaped, 4-conductor design 123, it can be seen that inserting a drum-brake conductor pin into a 4 conductor hole produces an electrical connection with pairs of conductors within the 4-conductor hole (i.e., 123c connected to 123d, and 123a connected to 123b) when oriented as shown. By rotating the drum-brake pin 90°, different pairs of conductors are interconnected (i.e., 123a connected to 123d, and 123b connected to 123c). This may be used to perform a multiplexing function (i.e., the selection of one or more inputs) within electronic circuitry where multiplexed circuits are chosen at the time of device assembly (i.e., pin insertion). More generally, contacts by any number of larger, conductive surfaces on smart pins may be made to interconnect any number of smaller smart tabs within holes. Conversely, tabs with large angular surface areas may be used to interconnect any number of conductors within a multi-conductor smart pin.

Smart pins and corresponding holes may be of any size. A smaller pin 121 and corresponding hole may be used to conserve circuit board real estate (i.e., size). For example, a small, 4-conductor, square pin 121 as shown in FIG. 12 may be used within circuits that do not carry large currents.

Conductive elements of a smart pin may readily be constructed from round wires 122. For example, in FIG. 12, round wires shown 122 are partially embedded in a pentagonal insulating core. Following core expansion, the wires are pressed solidly against corresponding tabs within a hole.

Alternatively, conductive elements of smart pins may be constructed from wires of any cross-sectional shape including elliptical 124. When oriented as shown 124, 126 in FIG. 12, the elliptical cross-sections of pin conductive elements 124, 126 increase contact areas with corresponding smart tabs (i.e., compared with round wires). This reduces contact resistance, decreasing unwanted voltage drops across contacts for a given current. Elliptical (or other shapes of wire) may be included in both round-126 and polygon-shaped 124 pins.

Conductive elements of smart pins may also be in the form of flat ribbons extruded or deposited onto the surface of a polygon 121, 128. Ribbon-like conductive elements maximize contact area, thus reducing electrical resistance between conductive elements on a pin and corresponding tabs within holes. Even within the same pin it is possible to "mix and match" different geometries of conductors, for example, to optimize the space occupied by an interconnection and simultaneously, the current-carrying capacity of a particular circuit. As illustrated in FIG. 12, within a pin that is mostly composed of ribbon contacts 125, an elliptical contact 125a is shown. The number of contacts per surface may also be altered. For example, two separate electrical contacts 125b are illustrated on one face of a hexagonal pin structure 125.

Ribbon-like conductive elements are also compatible with being a part of a planar pin structures. Planar pins have a rectangular cross-section with one dimension of the rectangle minimized, but sufficient to be structurally sound. Planar pins may be particularly useful to bring multiple conductive pathways to the edge of a circuit element or PCB. The circuit elements themselves may be turned on its edge, thus providing multiple pathway access to the top or bottom of a die (including so-called flip-chip designs).

Smart pins may contain electronic components. For example, in FIG. 12, a resistor 127a is shown embedded within a so-called drum-brake pin configuration. Exemplary embedded components may be classified as: 1) passive elements that include resistors, inductors, capacitors, transformers, networks and antennas; 2) active elements that include diodes, transistors, optoelectronic devices and integrated circuits; and 3) electromechanical elements that include switches, contacts, piezoelectric devices and fuses.

Embedded components (e.g., resistors, diodes, transistors), particularly those that are vertically embedded (i.e., with a long component axis that follows the long axis of the pin, normal to the circuitry within the plane of a PCB) may save significant space within circuit designs. The inclusion or exclusion of pins during the assembly process also promotes flexibility and optional element selection at the time of device assembly (i.e., during pin insertion).

In order to maintain a similar range of contact surface areas, large pins and associated holes may be used when there are a larger number of electrical contacts. Larger (i.e., greater diameter) pins may also be used for increased mechanical stability. In FIG. 12, an octagon-shaped pin is illustrated 128 with 8 ribbon contacts. The increase pin size promotes a larger interconnection surface contact area as well as larger gaps in non-trace or insulating regions. These larger gaps in insulating regions reduce stray capacitance and other dielectric effects including so-called cross-talk between different conductors. Thus, the control of pin size may be particularly important in circuits with high switching or transmission rates (i.e., where rates may be limited by unwanted, stray capacitance.

Figure 13:
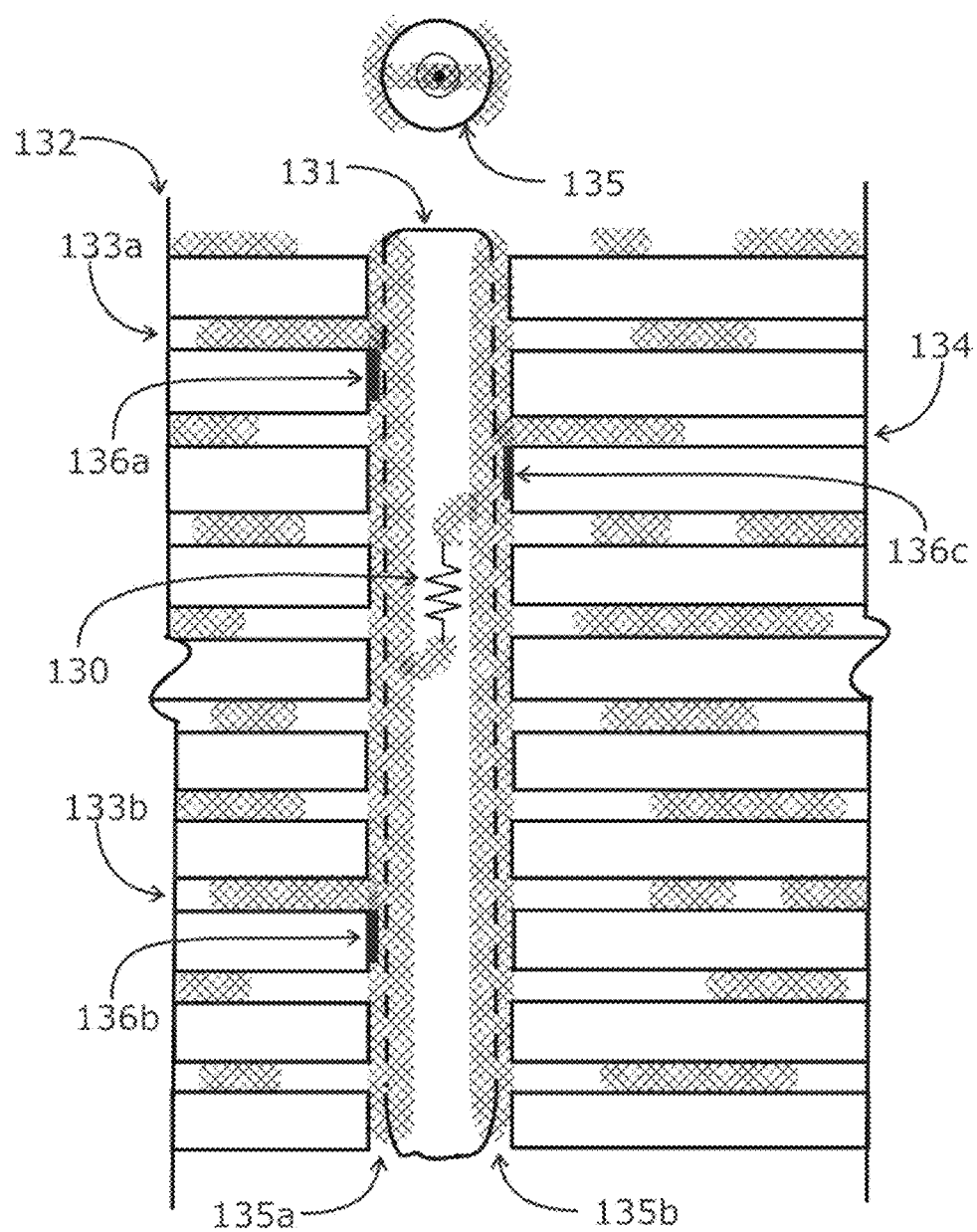
FIG. 13 shows a sectional view of a resistor embedded within a 2-conductor, so-called "brake-drum" pin.

FIG. 13 shows a sectional view of a resistor 130 embedded within a segment of a pin 131 that traverses multiple layers of a multi-layered PCB 132. Within the PCB 132, electrically conductive traces are shown as filled structures. As illustrated in the inset 135 showing a top-view, the pin is configured within a so-called drum-brake design with 2 electrical contacts 135a, 135b. The pin contact 135a shown on the left side of the pin 131 in FIG. 13 is interconnected with two electrical traces 133a, 133b within the PCB 132. The pin contact 135b shown on the right side of the pin 131 is interconnected with one electrical trace 134 within the PCB 132. All 3 interconnections 133a, 133b, 134 with the pin 131 include smart tabs 136a, 136b, 136c. Other traces of varying sizes and locations illustrated within the multi-layered PCB 132 do not make electrical contact with this particular embedded-component pin 131.

A specific exemplary embodiment that may utilize numerous pins containing one or more resistors (and possibly other components) involves so-called neuro-pins (described above) as one component of a neural network. One of the fundamental operations performed by a neural network to control each node within the network is the summing of weighted inputs from a number of other nodes (generally organized as successive layers) within the network. The summation may be performed by summing currents at a circuit junction. The amount of current or "weight" of a particular nodal input may be controlled by the one or more resistors within a neuro-pin. This allows a portion of a neural network or an entire neural network to be performed in an analog mode where the computational characteristics are determined at the time of assembly by selecting pin resistances.

A major advantage of such a hardware implementation of a neural network may be computational speed. Thus, applications may include those in which speed is important such as deciding when to stop an incoming projectile or controlling the balance of a robot. Neural network output(s) are computed at a rate that is primarily limited by the propagation of an electrical signal through the network, independent of any digital clocks. Additionally, such networks may consume less power and be more readily able (i.e., with a smaller number of nodes) to handle a number of continuously variable (i.e., analog) inputs. Some digital neural networks may include an analog portion (programmed using neuro-pins) to take advantage of such strengths while maintaining the ability to "learn."

Larger neural networks may require thousands or even millions of neuro-pins. Pin count may be reduced by incorporating multiple resistors (and any other circuitry) and associated contacts within a single pin. Resistance values may be controlled by selecting from repositories of pre-manufactured neuro-pins. Alternatively, neuro-pins may be laser-trimmed just prior to insertion, using techniques known in the art. Even the foundational layered structure of most common neural networks may be reflected in the physical structure of neural net circuitry. Using neuro-pins that traverse multiple layers, weights (i.e., resistance values) may be chosen across all layers of a particular nodal location using a single neuro-pin.

Figure 14:
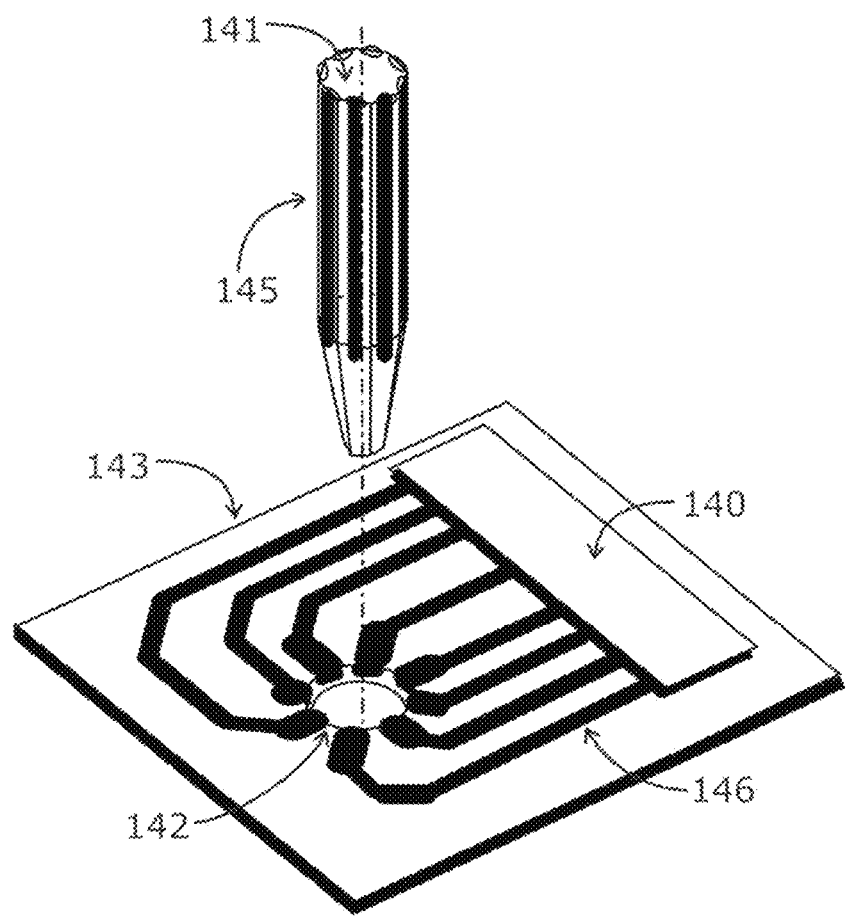
FIG. 14 illustrates the interconnection of eight electrical pathways within layers of a PCB using a single pin.

FIG. 14 illustrates the ability to interconnect eight conductive pathways or traces 146 on a PCB layer 143 with associated conductive elements 145 of an octagonal pin 141. When inserted into the hole 142 and expanded, the single pin 141 allows eight conductive pathways from any PCB layer contacted by pin 141 conductive elements to have electronic access to the surface mount component 140 (e.g., integrated circuit, field-programmable gate array) that has been place on the uppermost PCB layer shown in FIG. 14. Using pins with multiple contacts, large buses with many conductive pathways may effectively be interconnected to multiple layers within a PCB using relatively few pins.

Figure 15:
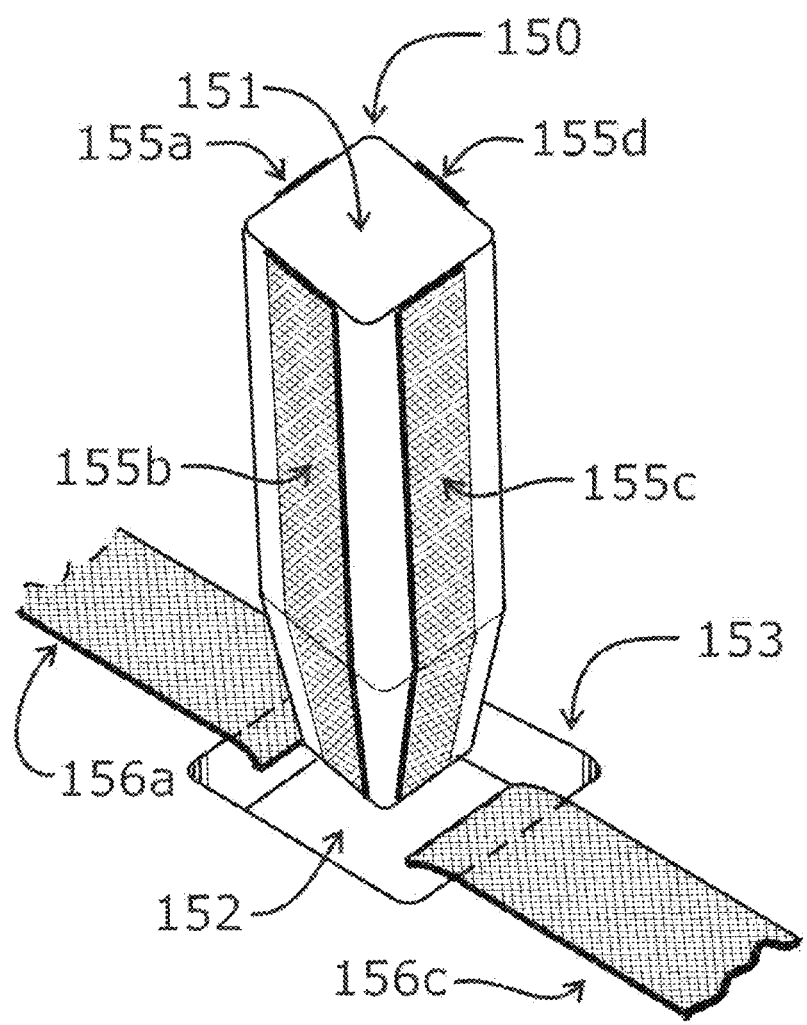
FIG. 15 illustrates a 4-conductor, square pin where only two of the conductors are used within a particular PCB layer.

FIG. 15 illustrates a 4-conductor 155a, 155b, 155c, 155d, square pin 150 where only two of the conductors 155a, 155c and associated traces 156a, 156c are used within a the PCB layer 153 shown in the figure. When the pin 150 in inserted and the pin core 151 expanded, all conductors 155a, 155b, 155c, 155d press against the walls of the hole 152; however, those conductors that lack an associated tab and trace 155b, 155d do not form an electrical circuit. Those unconnected conductors 155b, 155d may contact other layers with a multi-layered PCB or electronic component. Even if unconnected throughout all layers of a PCB, in exemplary embodiments, it may be more economical to produce a single or limited number of pin styles (e.g., 4-conductor square) even if some pin conductors go unused within some holes.

Figure 16:
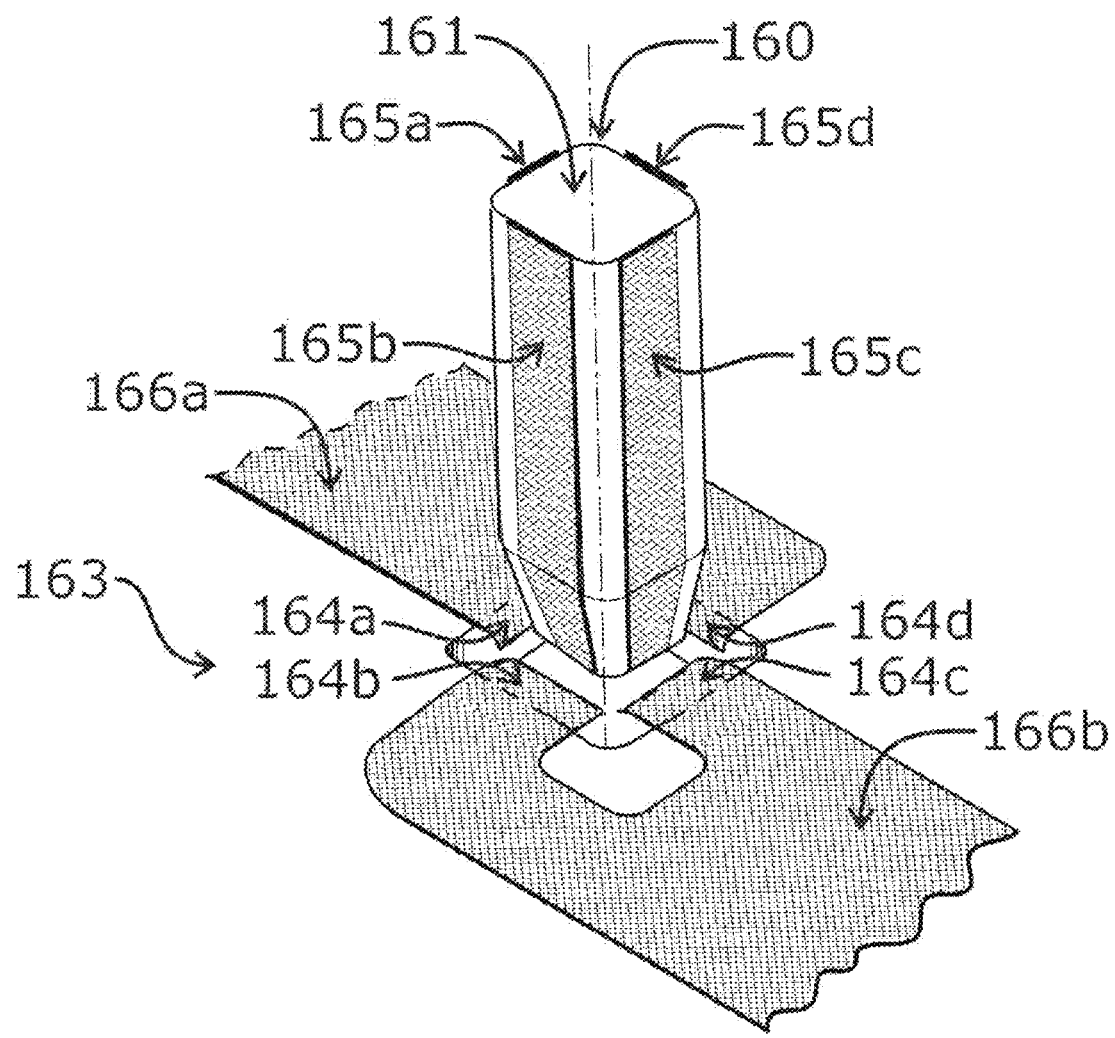
FIG. 16 illustrates a 4-conductor, square pin where pairs of conductors are used in parallel within electronic circuits to reduce overall circuit contact resistance, thereby increasing the current-carrying capacity (for a given voltage drop) of the circuits.

FIG. 16 illustrates a 4-conductor 165a, 165b, 165c, 165d, square pin 160 where pairs of conductors (165a paired with 165d and 165b paired with 165c) and their associated tabs (164*a* paired with 164*d* and 164*b* paired with 164*c*) are used in parallel in electrical circuits within a PCB layer 163. Multiple, parallel circuit contacts reduce overall circuit contact resistance, thereby increasing the current-carrying capacity (within a given voltage drop) of electrical circuits. Paired tabs are electrically continuous with thickened traces (tab 164*a* paired with tab 164*d* connected to trace 166*a* and tab 164*b* paired with tab 164*c* connected to trace 166*b*) to further enhance current carrying capacity. Such parallel multiple-conductor pathways may be used to increase the current carrying capacity of selected circuit elements (e.g., power and ground pathways) and/or provide redundancy to improve robustness of critical circuit elements.

Figure 17:
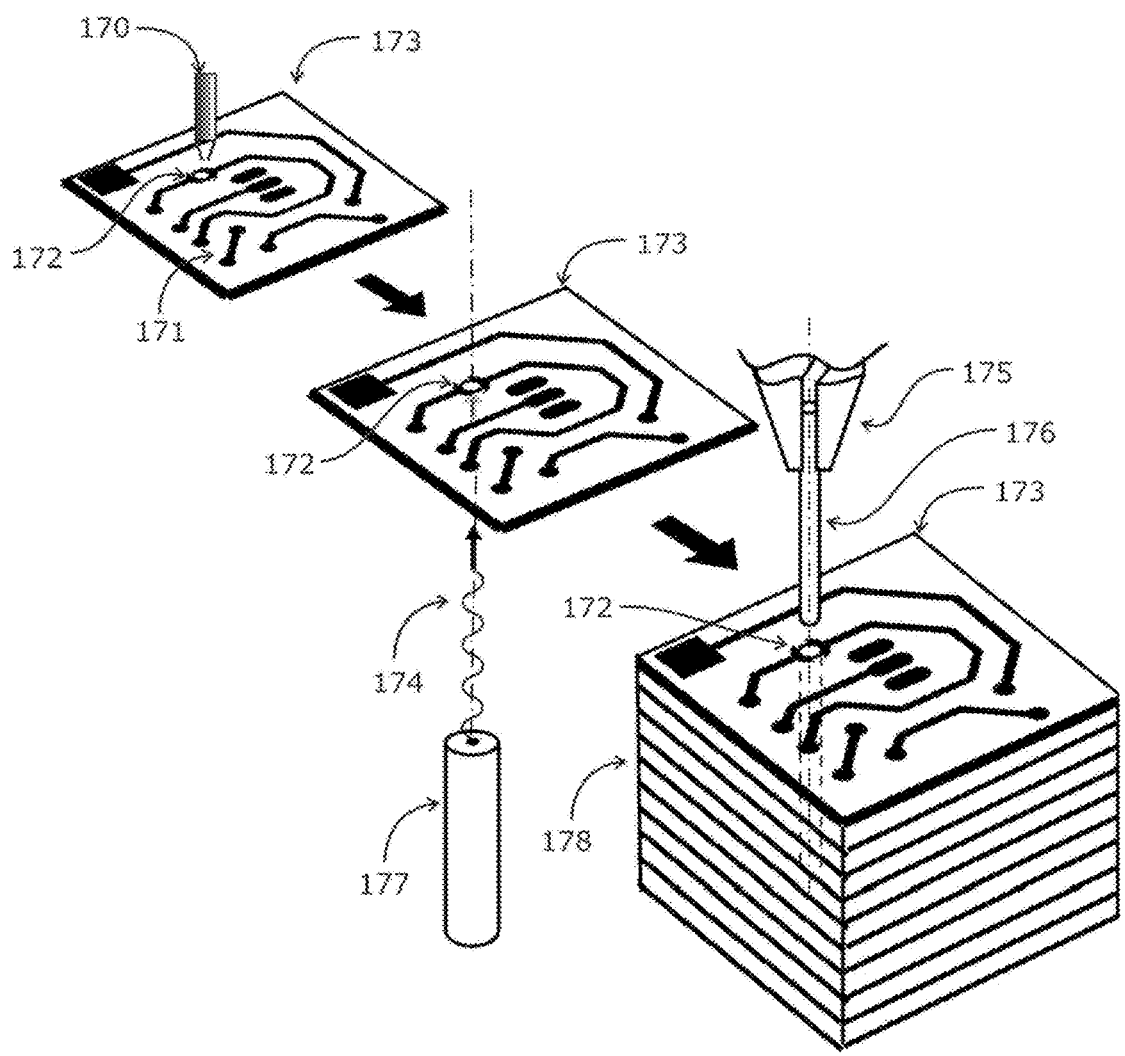
FIG. 17 illustrates the key steps in the assembly of a multi-layered PCB using a smart pin-and-tab architecture.

FIG. 17 illustrates exemplary steps to assemble a 3-dimensional PCB circuit using the pin-and-tab architecture. Starting with a PCB layer 173 in which traces 171 have been formed, drops of material (as illustrated in FIG. 8) may optionally be deposited 170 onto the regions where tabs fold over PCB layers into holes 172. Next, a laser 177 produces electromagnetic radiation 174 that ablates and to forms holes 172 within PCB substrates without affecting the conductive traces 171 within the PCB layer 173. Finally, the newly-formed layer 173 is stacked atop other PCB layers 178 as a portion of a continuous process to yield a 3-dimensional assembled circuit. If the newly-formed layer is the top (i.e., terminal) layer for a particular pin, then the pin 176 is inserted 176 into the corresponding hole 172. The pin may either be pre-sized (i.e., cut) to traverse a designed number of layers, or laser ablation may be used to sever the pin in situ (as described in FIG. 7) following insertion. The layering process is repeated until all layers and components for the device are assembled.

Figure 18:
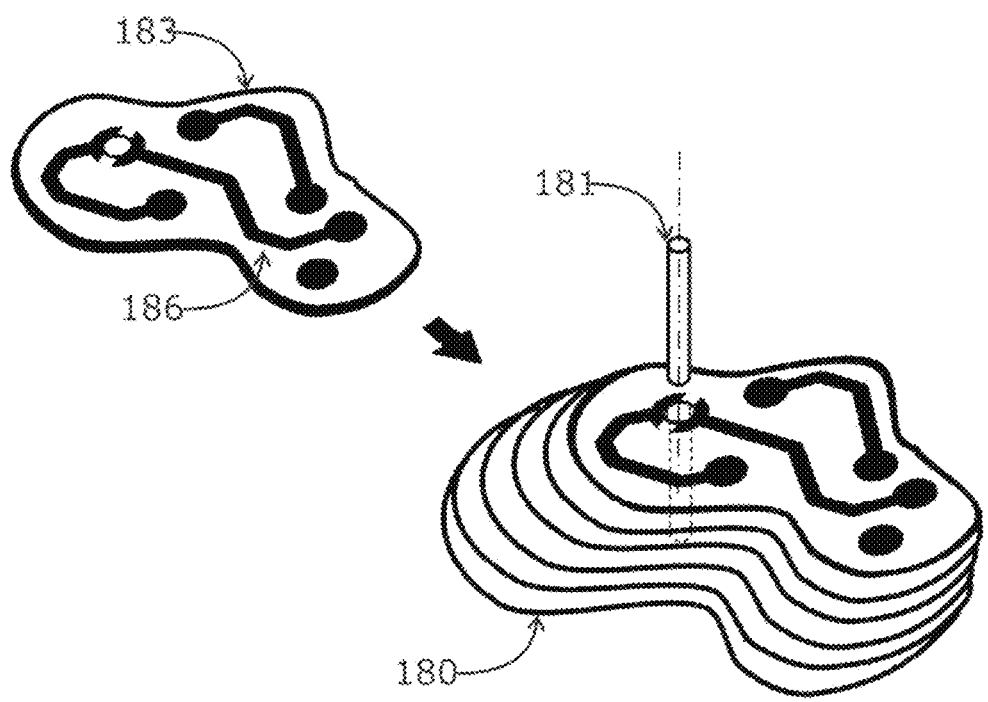
FIG. 18 illustrates the ability to produce amorphic, 3-dimensional forms with embedded electronics using laser ablation and the pin and tab architecture.

FIG. 18 illustrates the assembly of custom-shaped PCB layers 183 with circuitry 186 to form devices of almost any 3-dimensional form or profile 180 containing embedded circuitry. Individual circuit layers 183 and components may be secured by pins 181 as well as adhesives.

Figure 19:
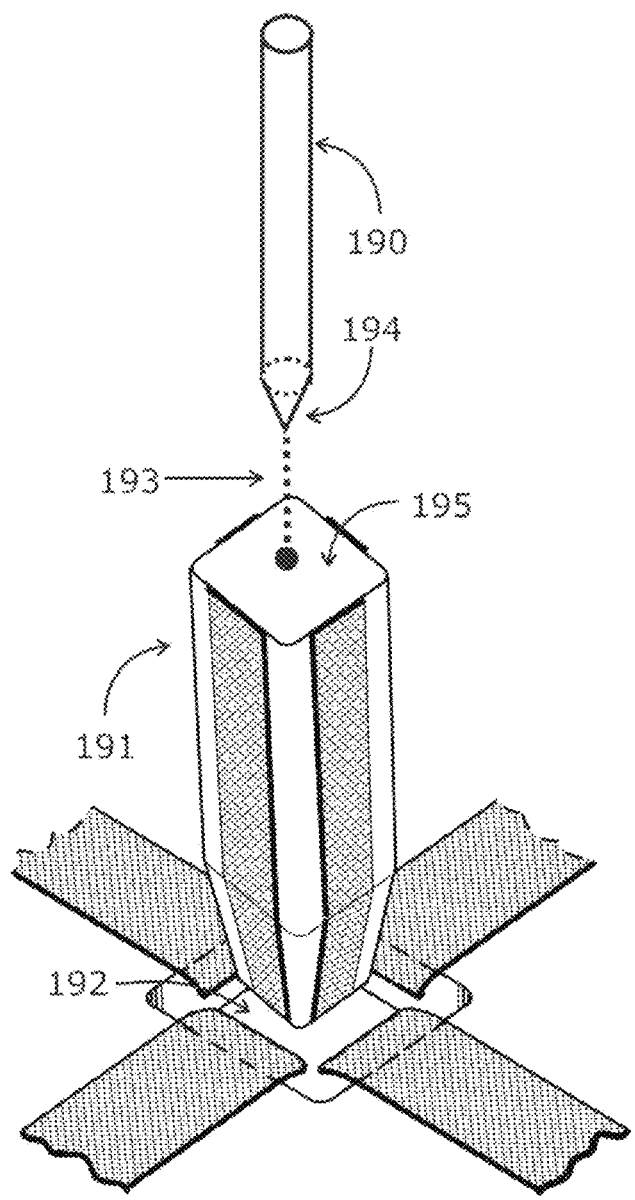
FIG. 19 illustrates the expansion of a square pin using a rod-shaped wedge with a conical insertion tip.

FIG. 19 illustrates an alternative embodiment of pin expansion that uses an inserted wedge or filler 190 to expand a pin's 191 core 195. In this example, a square pin 191 is first inserted into its corresponding hole 192. Next, a rod-shaped wedge or filler material 190 with a conical tip 194 is inserted 193 into the core material 195 of the pin 191. The core material 195 of the pin 191 is generally more pliable than the wedge or filler 190. Insertion of the wedge or filler material 190 caused the core 195 of the pin 191 and surface pin contacts to exert force against the walls of the hole 192, enabling secure electrical connections to be made.

More generally, wedges of a variety of different shapes may be used to expand the core material of a pin. For example, wedges may be in the shape of a rod, cross, square, star, rectangle, multi-sided pentagon, and the like. Different wedge shapes may be used with different pin shapes where the goal is to generally apply an equal force in all radial directions upon insertion. Wedges may optionally include a taper to help facilitate and guide the insertion into the pin core. Alternatively or in addition, pin cores may be scored or dimpled at the insertion point or have a hollow or soft interior to facilitate the insertion of a wedge or filler. Once securely inserted, a wedge or filler is generally trimmed or cut at the same height as the pin.

In additional exemplary embodiments, particularly within small-diameter pins, carbon nanofibers and/or nanotubes may be used as foundational wedge elements. Carbon nanofibers (CNFs) may be vapor-grown (along with alternative methods including those assisted by forming plasmas) to cylindrical structures with stacked graphene layers. In addition to structural shape, a key property that is particularly useful when used as a wedge, is the hardness of the filament or fiber at such small dimensions (where carbon nanotubes can be <200 nm in diameter). Other CNF properties including high thermal conductivity and/or electrical conductivity (i.e., as interior conductive pathways) may be used in some applications. One or more CNFs may be inserted into the core of a pin, generating expansion forces in all radial directions.

FIGS. 1-19 describe smart pins that are compatible with high-rate micro-extrusion processes. If pins are micro-assembled from components, constructed using additive manufacturing (i.e., 3-D printing) or other manufacturing techniques are used, then fewer constraints are placed on pin designs. For example, conductive "rings" or portions of rings may be used to make pin-to-tab connections. Axial conductors within the pin may then be used to electrically connect rings or portions of rings along the long axis of the pin. Such "rings" may cover the perimeter or a portion of the perimeter of a round pin, or the sides of a multi-sided polygon (e.g., square, rectangle, hexagon, octagon). Tabs may be folded into a hole that occupy any portion of the hole or the entire hole.

When using additive manufacturing techniques, many of the same core materials as described above may be used as insulating segments. Polymers and plastics are generally compatible with the micro-extrusion and deposition processes used in additive manufacturing. Although 3-D printers may be used to form metallic (i.e., electrically conductive) components, these are generally designed to manufacture larger scale objects. For micro-scales structures that require electrically conductive segments, conductive compounds that contain metallic nanoparticles and conductive organic polymers are compatible with the deposition process.

The following figures illustrate designs that are compatible with micro-assembly and additive manufacturing approaches.

Figure 20A:
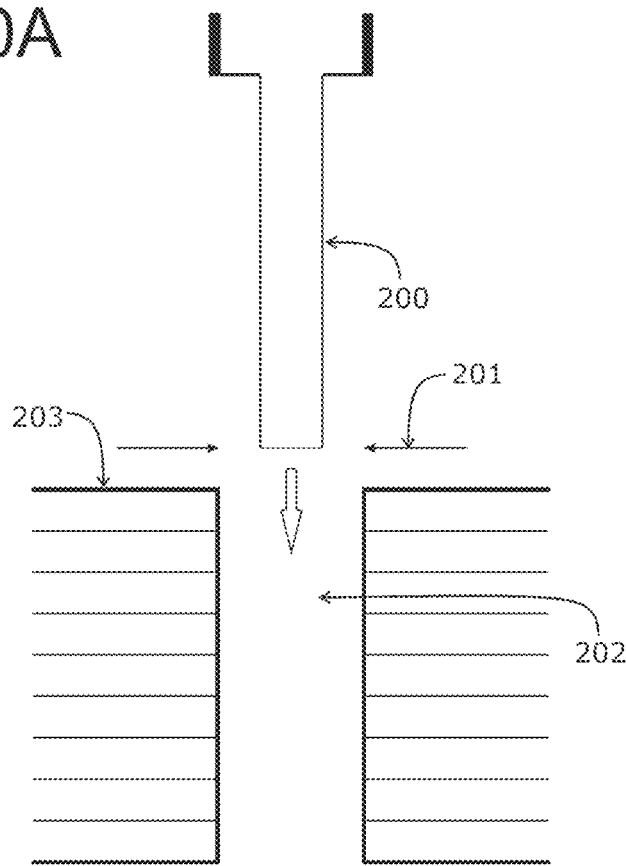
FIG. 20A illustrates a rod-shaped pin as an alternative embodiment to a tapered pin.

FIG. 20A shows a pin 200 that illustrates an alternative pin form that takes into account spatial tolerances to align a pin 200 into a hole 202 during the pin 200 insertion process. In this case, there is no taper and the simple, rod-like pin 200 shape helps facilitate the pin 200 manufacturing process. Pin insertion remains possible, even if not completely centered within the dimensions 201 of a hole 202 within a PCB or component. This is due to a reduced radial dimension 201 of the pin 200. The reduced radial dimension 201 of the pin 200 does necessitate a greater radial expansion of the pin 200 following insertion. Absent a taper, the pin 200 initially does not "self-center" during insertion, but does so upon expansion.

Figure 20B:
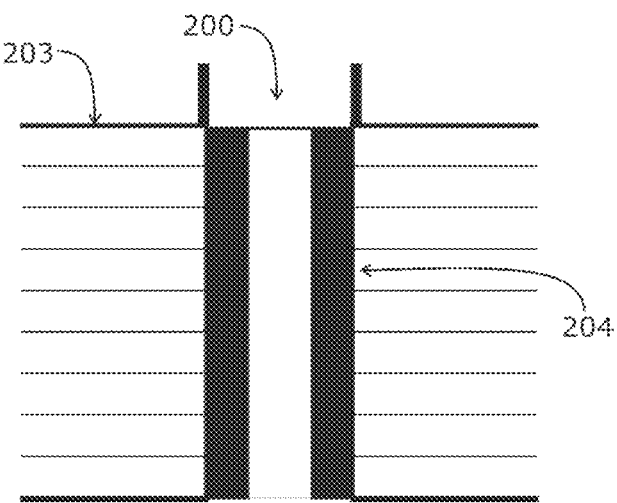
FIG. 20B shows the pin expansion to fill a hole corresponding to a rod-shaped pin.

FIG. 20B shows the rod-like pin 200 illustrated in FIG. 20A inserted into a hole 202 within a multi-layered PCB or component 203. When using the rod-like design, if expansion is triggered by a chemical reaction induced by a fluid surrounding the pin (shown as solid fill), the entire pin 200 is fully exposed to the fluid 204. Capillary action helps to draw fluid into the region surrounding the pin 204. As described in explanations of other pin forms, the pin 200 may contain multiple electrical contacts on its perimeter that form electrical connections to electrical traces within layers of the PCB or component 203.

Figure 21A:
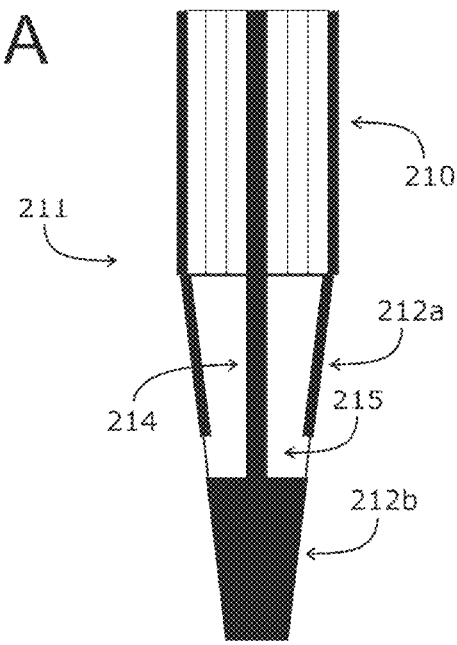
FIG. 21A illustrates a small, dual-lead component (e.g., capacitor) atop a pin.

FIG. 21A shows an electronic component 210 (e.g., capacitor, diode, resistor, etc.) that requires two electrical connections 212*a*, 212*b*, mounted atop a pin 211. The two electrical contacts 212*a*, 212*b* are formed by conductive surfaces on the upper 212*a* and lower 212*b* halves of the pin 211. Each half 212a, 212b may traverse multiple circuit layers, providing circuit design flexibility by allowing electrical connections to be made in any one or more of the traversed layers. Electrical connection between the component 210 and the lower conductive surface 212b is enabled by an axial conductor (shown as solid fill) 214 surrounded by expandable core insulation 215 within the pin 210.

Figure 21B:
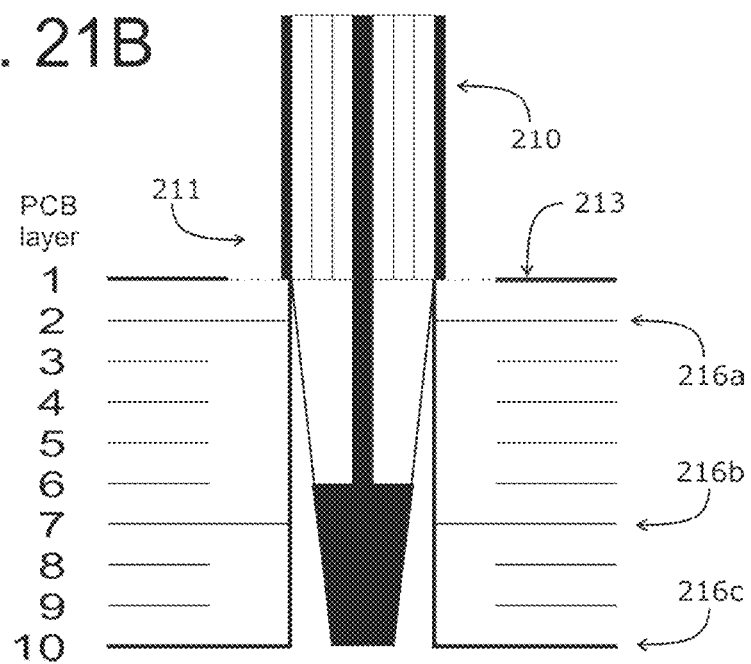
FIG. 21B shows the insertion of a dual-contact pin with a small lip that limits pin travel.

FIG. 21B illustrates the positioning of the dual-lead component mounted atop the pin 210 shown in FIG. 21A following pin insertion but prior to pin expansion. In this example, the pin 211 and dual lead component 210 are inserted into a 10-layer PCB 213. The pin 211 electrical contacts 212a, 212b have the potential to make electrical connections with multiple layers within the PCB 213.

Figure 22A:
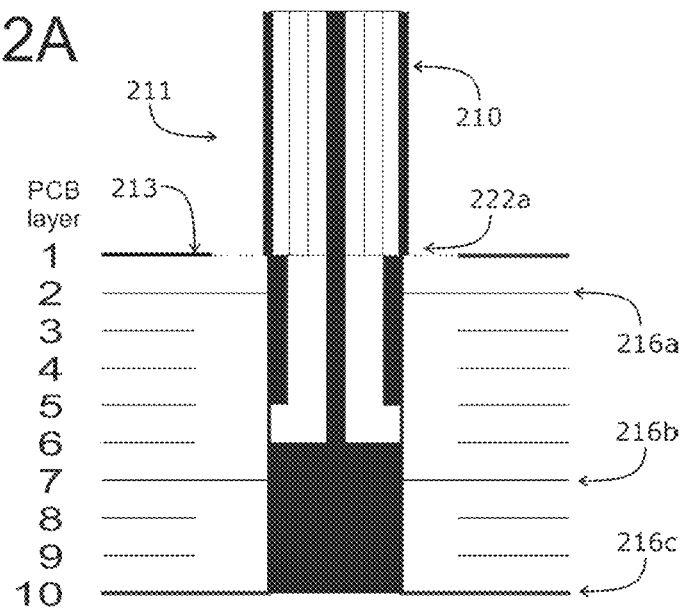
FIG. 22A shows the expansion of a dual-contact pin with a small component atop the pin.

FIG. 22A shows the same pin 211 and dual-lead component 210 illustrated in FIGS. 21A and 21B following pin expansion. When the pin 211 is expanded, the upper conductor 212a of the pin 211 makes contact with second PCB layer 216a. The lower conductor 212b of the pin 211 makes simultaneous contact with traces within the seventh 216b and tenth 216c PCB layers. This connection not only provides an electrical pathway from the PCB 213 to the component 210, but also between different layers within the PCB 213.

Figure 22B:
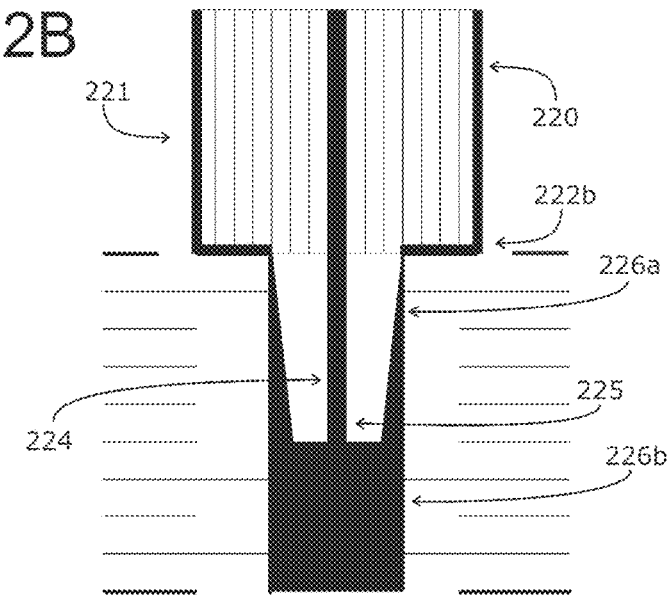
FIG. 22B illustrates the insertion and expansion of a dual contact pin with a large component atop the pin.

FIG. 22B shows an example of an electrical component 220 that requires more volume than can be mounted directly above a single pin 221 (e.g., a large-value capacitor or inductor). Components (e.g., 220) may be enlarged in radial and/or height dimensions to accommodate necessary volume. In the exemplary case illustrated in FIG. 22B, the component 220 requires two electrical contacts 226a, 226b where the pin contact 226b furthest from the component 220 is made electrically continuous by an axial conductor 224 embedded within the insulating pin core 225.

In the case of large components mounted atop pins 221 such as shown in FIG. 22B, a lip 222b may be used to limit the travel of the pin during the insertion process. In the case of smaller components such as illustrated in FIG. 22A, a lip 222a may or may not be included to limit the travel of pins during insertion.

Figure 23A:
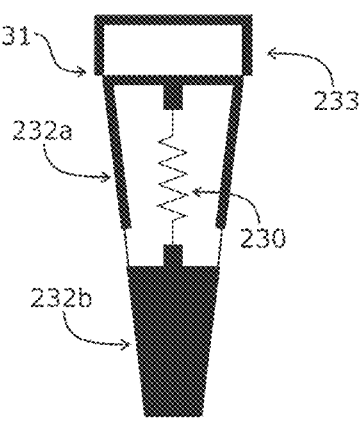
FIG. 23A illustrates the embedding of a small, dual-contact component (e.g., resistor) within a neuro-pin.

FIG. 23A shows an example of an electrical component (i.e., resistor) 230 embedded within a dual-contact 232a, 232b pin 231. Small electrical components such as resisters, diodes, transistors, etc. may be embedded within pins 231. Pins 231 may optionally be enlarged to accommodate components over a range of sizes.

Figure 23B:
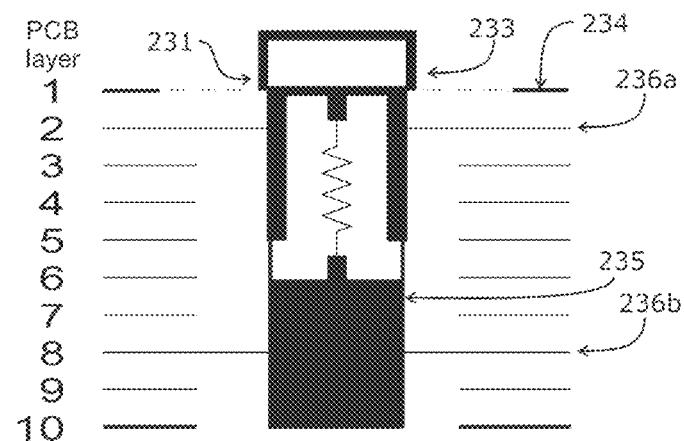
FIG. 23B illustrates the expansion of a dual-contact pin with an embedded component.

FIG. 23B shows the insertion and expansion of the pin 231 with an embedded resistor illustrated in FIG. 23A into a 10-layer PCB 234. Expansion causes electrical contacts on the periphery of the pin 232a, 232b to be in electrical continuity with tabs on the wall of the PCB hole 235. In this example, the upper contact 232a of the resistor within the pin 231 is connected to the second layer 236a of the PCB 234 and the lower contact 232b of the resistor 230 is connected to the eighth layer 236b of the PCB 234.

FIGS. 23A and 23B also show an example of a small, optional "stub" 233 that protrudes above the level of the uppermost PCB layer 234. This optional stub 233 may be used in a number of ways including facilitating manual (i.e., not assisted by a machine) mechanical insertion or removal of a pin (e.g., during debugging procedures), and/or a touch point for a probe to sense the electrical voltage at this location in the circuitry during operation.

Figure 24A:
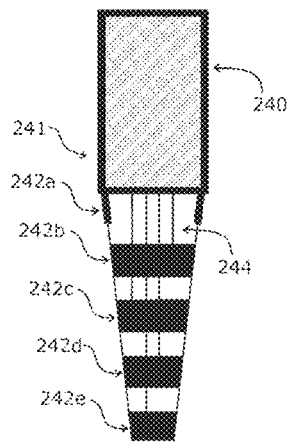
FIG. 24A illustrates the construction of a 5-conductor pin with a complex component (e.g., integrated circuit) atop the pin.

FIG. 24A shows an example of a circuit (e.g., FPGA, ASIC) 240 that requires more than two electrical pathways with ring-like contacts mounted atop a pin 241. In this example, five conductive pathways 244 and associated contacts 242a, 242b, 242c, 242d, 242e are included within the pin 241.

Figure 24B:
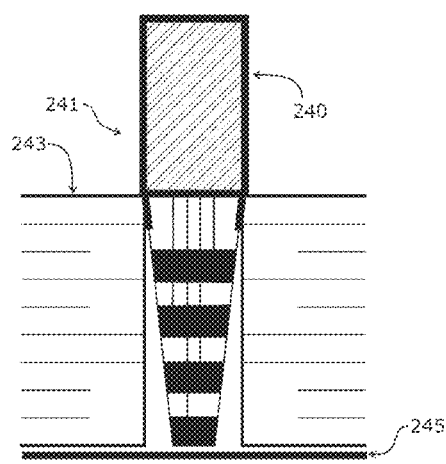
FIG. 24B illustrates the insertion of a 5-conductor, ring-contact pin.

FIG. 24B illustrates the insertion of the pin 241 and mounted component 240 shown in FIG. 24A into a 10-layer PCB 243. FIG. 24B also demonstrates the use of a so-called "stop plate" to limit the travel of the pin 241 during the insertion process. The stop place 245 may optionally be removed following insertion and expansion.

Figure 24C:
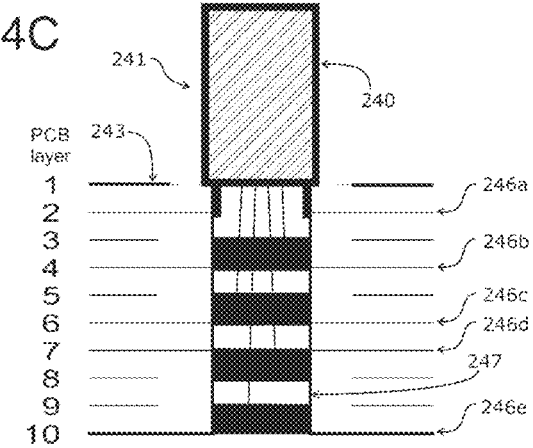
FIG. 24C illustrates the expansion of a 5-conductor, ring-contact pin.

FIG. 24C illustrates the results of pin expansion of the 5-lead circuit shown in FIG. 24B within a 10-layer PCB 243. In the exemplary connections shown in FIG. 24C, the uppermost pin contact 242a makes an electrical connection with the second PCB layer 246a. The next pin contact 242b makes an electrical connection with the fourth PCB layer 246b. The next pin contact 242c makes an electrical connection with the sixth PCB layer 246c. The next pin contact 242d makes an electrical connection with the seventh PCB layer 246d, and the lowermost pin contact 242e makes an electrical connections with the lowermost PCB layer 246e. The ability to have individual contacts traverse multiple layers within a PCB or component provides flexibility for electronics designers.

Figure 25A:
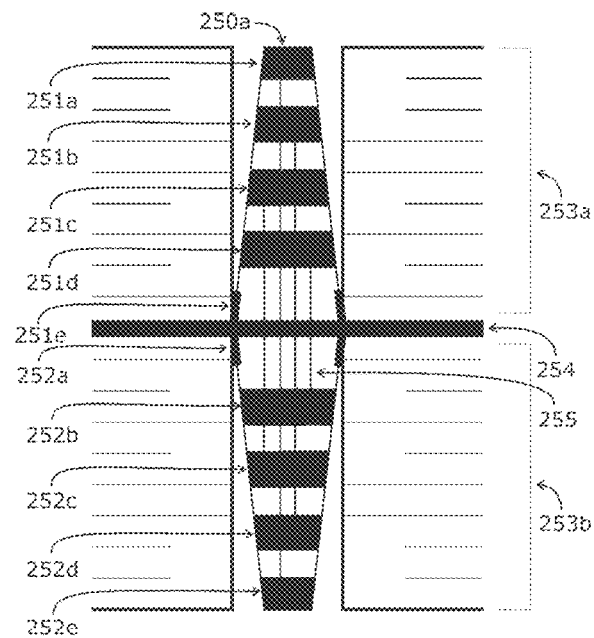
FIG. 25A illustrates the construction of a 5-conductor "dowel" pin.

FIG. 25A illustrates the construction of a pin or dowel 250a that is designed to traverse a fixed distance (or equivalently, number of layers) of circuitry. In this exemplary case, the dowel 250a is designed to interconnect two adjacent PCBs or components with five conductive elements. Five contacts 251a, 251b, 251c, 251d, 251e on the upper portion 253a of the pin 250a are interconnected via internal pin pathways 255 with five contacts 252a, 252b, 252c, 252d, 252e on the lower portion 253b of the pin 250a. The two portion 253a, 253b of the pin 250a electrically, thermally and mechanically interconnect adjacent layers with a tight interface 254.

Figure 25B:
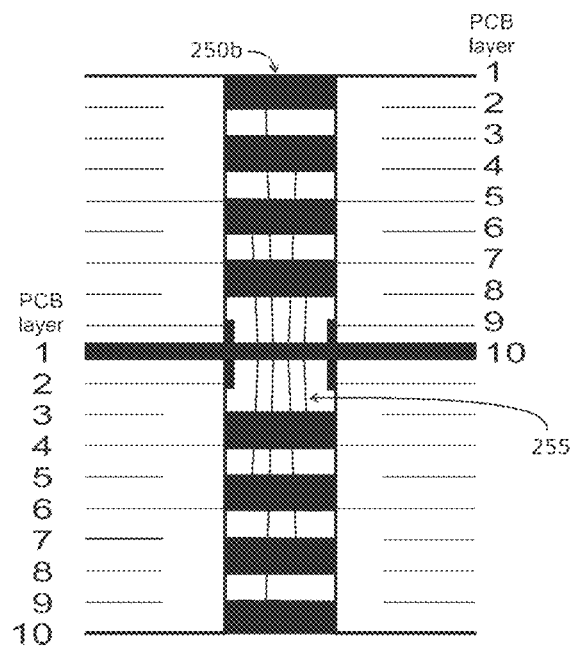
FIG. 25B illustrates the expansion of a 5-conductor "dowel" pin.

FIG. 25B shows the pin 250b illustrated in FIG. 25A, acting as a dowel, fully expanded into the holes within the adjacent portions 253a, 253b of PCB and/or component layers. In this exemplary case, the following table shows interconnections.

TABLE 1

Exemplary dowel interconnections

| pin contact number | upper portion 253a PCB layer | lower portion 253b PCB layer |
| --- | --- | --- |
| 1 | 1 | 10 |
| 2 | unused | unused |
| 3 | 5 | 6 |
| 4 | 7 & 8 | 4 |
| 5 | 9 & 10 | 1 & 2 |

The pin or dowel illustrated in FIG. 25B may be mass-produced (e.g., by the millions) prior to an assembly process. A relatively small number of standard, expandable pin configurations may provide a designer with great flexibility in circuit designs. Standard pins may be of differing lengths with differing numbers of contacts. Such standard pin or dowel configurations may lead to some unused conductive pathways as illustrated by pin contact number 2 in Table 1. The ability to mass-produce large numbers offsets costs during occurrences of unused pathways. In some designs, it may be beneficial to use such pin pathways in parallel with other interconnections to reduce circuit resistance.

Figure 26A:
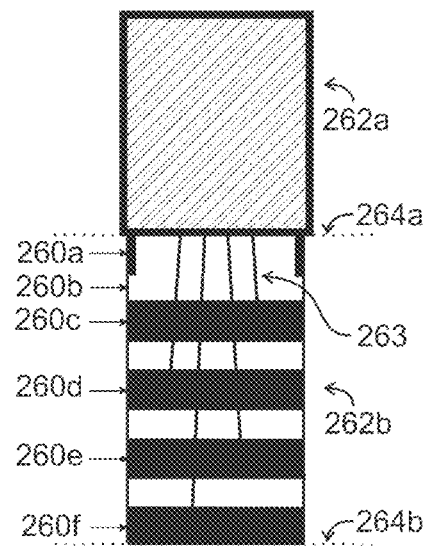
FIG. 26A illustrates the construction of a 5-conductor pin with a circuit atop the pin.
Figure 26B:
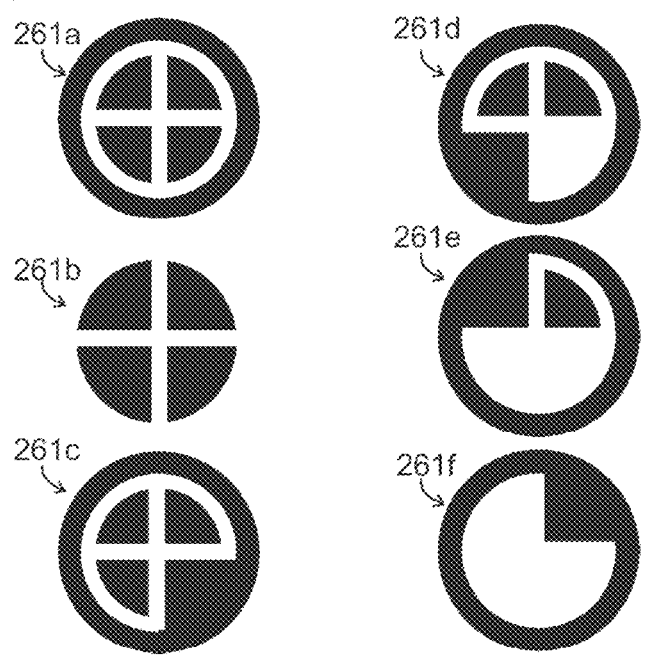
FIG. 26B shows cross-sectional views of conductive and insulating elements within a 5-conductor pin.

FIGS. 26A and 26B illustrate an exemplary embodiment of internal conductive pathways to connect PCB traces with a component 262a mounted atop a fully inserted round pin 262b. FIG. 26A shows the component (e.g., integrated circuit) connected via internal conductive pathways 263 and ring-like pin contacts to traces within layers between the top 264a and bottom 264b boundaries of the PCB. FIG. 26A also shows layered positions 260a, 260b, 260c, 260d, 260e, 260f where corresponding pin cross-sections 261a, 261b, 261c, 261d, 261e, 261f are depicted in FIG. 26B.

In FIG. 26B, pin cross-sections 261a, 261b, 261c, 261d, 261e, 261f show filled dark regions representing electrically conductive elements and white regions representing insulating elements. A total of five (5) conductive pathways are available for connections between the component 262a and PCB layers (between 264a and 264b). The uppermost electrical contact is simply a conductive ring 261a within the pin 262b that is connected directly to the component 262a. The remaining four (4) conductive elements 263 each carry current via conductive (pie-shaped) quadrants 261b within the interior of the pin 262b. Moving in sequential stages down the pin 260c, 260d, 260e, 260f, each conductive quadrant is constructed to be in electrical continuity with a single ring-like pin contact 261c, 261d, 261d, 261e respectively.

More generally, any number of conductive pathways may be brought via internal pin pathways to surface pin contacts. As the number of internal pathways increases, the cross-sectional area of each pathway decreases resulting in an increase in resistance to carrying charge. This may limit the frequencies of voltage changes carried within the pin. The increase in resistance may be offset by increasing the size of the pin. Another challenge of increasing the number of internal pathways is the increase in complexity of manufacturing using traditional assembly techniques. However, almost any level of complexity may be managed using additive manufacturing (i.e., 3-D printing) techniques to "print" pins.

Figure 27A:
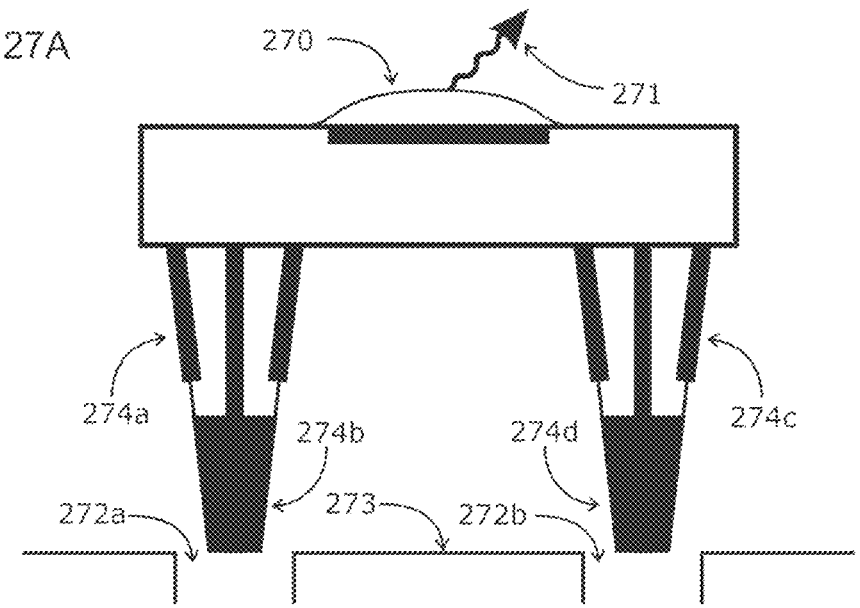
FIG. 27A illustrates the mounting of a light-emitting diode (LED) using two 2-conductor pins.
Figure 27B:
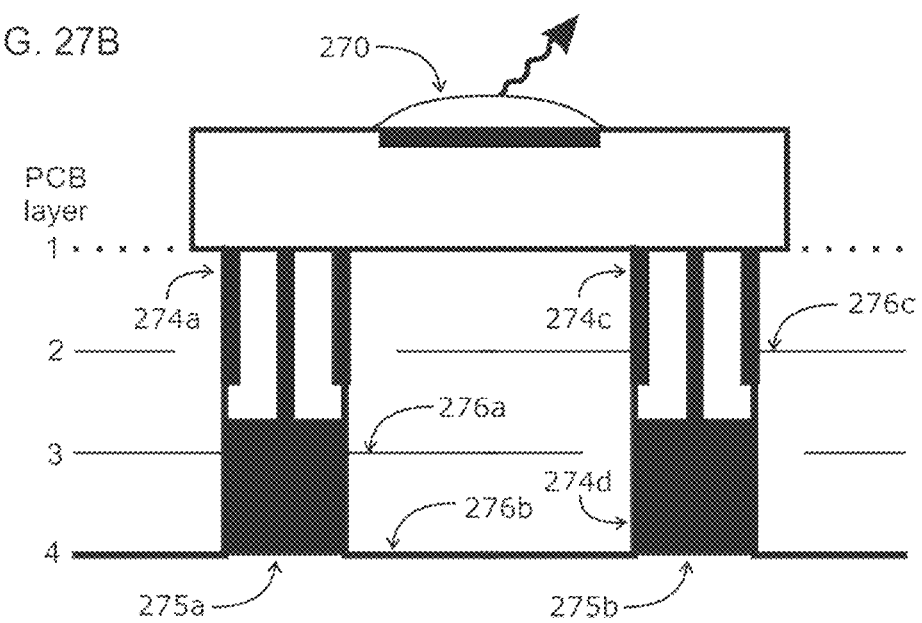
FIG. 27B illustrates the expansion of two 2-conductor pins to mount a LED.

FIG. 27A shows an example of a component 270 that requires more than a single pin for mounting. Multiple pins may be required for a component if, for example, 1) more electrical contacts are required than may fit within one pin, 2) component size dictates multiple pins for mechanical stability, or 3) component orientation calls for multiple supports. In FIGS. 27A and 27B, a light-emitting diode (LED) and optics 270 are mounted using multiple pins 275a, 275b for mechanical orientation and stability to allow light 271 to emanate in the direction away from the PCB surface 273.

FIG. 27B illustrates the multi-pin LED 270 shown in FIG. 27A with fully inserted and expanded pins 275a, 275b within their corresponding holes 272a, 272b. In this example, the upper conductive ring 274a of the left pin 275a is not electrically connected whereas the lower ring 274b is connected to both the third PCB layer 276a and the fourth PCB layer 276b. The upper conductive ring 274c of the right pin 275b is connected to the second PCB layer 276c and the lower conductive pin surface is connected to the fourth PCB layer 276b. When such components are mass-produced, the ability to connect to multiple layers and/or to handle circuit boards with different layer thicknesses expands the range of applications and provides flexibility for the design engineer.

The foregoing disclosure of the exemplary embodiments has been presented for purposes of illustration and description. It is not intended to be exhaustive or to limit the invention to the precise forms disclosed. Many variations and modifications of the embodiments described herein will be apparent to one of ordinary skill in the art in light of the above disclosure.

Further, in describing representative embodiments, the specification may have presented methods and/or processes as a particular sequence of steps. However, to the extent that the methods or processes do not rely on the particular order of steps set forth herein, the methods or processes should not be limited to the particular sequence of steps described. As one of ordinary skill in the art would appreciate, other sequences of steps may be possible. Therefore, the particular order of the steps set forth in the specification should not be construed as limitations on the claims.

While the invention is susceptible to various modifications, and alternative forms, specific examples thereof have been shown in the drawings and are herein described in detail. It should be understood, however, that the invention is not to be limited to the particular forms or methods disclosed, but to the contrary, the invention is to cover all modifications, equivalents and alternatives falling within the scope of the appended claims.

What is claimed is:

1. A method for producing electrical connections, comprising:
   one or more circuit elements within a first electrical circuit;
   one or more additional circuit elements within a second electrical circuit;
   manufacturing a pin to insert into a hole that traverses one or more layers of the first electrical circuit and one or more layers of the second electrical circuit,
   wherein the hole is lined by one or more electrical contacts in electrical continuity with at least one of the circuit elements,
   wherein the pin comprises an insulating material and one or more electrically conductive pathways that connect one or more circuit elements; and
   inserting the pin into the hole produces electrical connections between the one or more electrical contacts lining the hole and the one or more electrically conductive pathways on the pin.

2. The method of claim 1, wherein the circuit elements comprise one or more of passive electronic elements, active electronic elements, and electromechanical elements.

3. The method of claim 1, wherein the circuit elements comprise passive electronic elements including one or more of resistors, inductors, capacitors, transformers, networks, and antennas.

4. The method of claim 1, wherein the circuit elements comprise active electronic elements including one or more of diodes, transistors, optoelectronic devices, and integrated circuits.

5. The method of claim 1, wherein the circuit elements comprise electromechanical elements including one or more of switches, contacts, piezoelectric devices, and fuses.

6. The method of claim 1, wherein the insulating material includes a foaming agent that expands following insertion.

7. The method of claim 1, wherein the insulating material is mechanically compressed prior to insertion, allowing expansion after insertion.

8. The method of claim 1, wherein the insulating material is cooled prior to insertion and allowed to warm, causing expansion after insertion.

9. The method of claim 1, wherein the insulating material is heated prior to insertion causing the insulating material to soften, allowing expansion into the hole upon application of force during insertion and mechanical locking upon hardening when subsequently cooled.

10. The method of claim 1, wherein the connection of the one or more electrical connections is produced due to expansion of the insulating material.

11. The method of claim 1, wherein the pin mechanically locks within the hole due to expansion of the insulating material.

12. The method of claim 1, where the pin and corresponding hole are one of round, square, triangular, rectangular, planar, pentagonal, hexagonal, heptagonal, octagonal and an N-sided polygon where N is greater than 3.

13. The method of claim 1, where the insulating material is one of an elastomer, polymer, polyvinyl chloride, plastic and rubber.

14. The method of claim 1, where the insulating material includes a plasticizer additive that is one of esters, polyvinyl chloride, phthalate ester, sebacates, adipates, terephthalates, dibenzoates, gluterates, phthalates and azelates.

15. The method of claim 6, where the foaming agent is one of plastic, polyvinyl chloride, or polymer.

16. The method of claim 1, where the pin is manufactured by a process that includes one of extrusion and inkjet printing.

17. The method of claim 1, where the pin is manufactured by a process that includes additive manufacturing.

\* \* \* \* \*